US011362252B2

(12) United States Patent
Vashaee et al.

(10) Patent No.: US 11,362,252 B2
(45) Date of Patent: Jun. 14, 2022

(54) THIN FILM THERMOELECTRIC GENERATOR

(71) Applicant: North Carolina State University, Raleigh, NC (US)

(72) Inventors: Daryoosh Vashaee, Raleigh, NC (US); Jie Liu, Raleigh, NC (US); Mehmet Ozturk, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 36 days.

(21) Appl. No.: 16/617,327

(22) PCT Filed: May 25, 2018

(86) PCT No.: PCT/US2018/034600
§ 371 (c)(1),
(2) Date: Nov. 26, 2019

(87) PCT Pub. No.: WO2018/218127
PCT Pub. Date: Nov. 29, 2018

(65) Prior Publication Data
US 2020/0152848 A1    May 14, 2020

Related U.S. Application Data

(60) Provisional application No. 62/511,938, filed on May 26, 2017.

(51) Int. Cl.
*H01L 35/08* (2006.01)
*H01L 35/16* (2006.01)
(Continued)

(52) U.S. Cl.
CPC ............. *H01L 35/08* (2013.01); *H01L 35/16* (2013.01); *H01L 35/30* (2013.01); *H01L 35/32* (2013.01)

(58) Field of Classification Search
None
See application file for complete search history.

(56) References Cited

U.S. PATENT DOCUMENTS 4,049,469 A    9/1977  Kolomoets et al.
6,000,225 A *  12/1999 Ghoshal .................. F25B 21/02
                                                        62/3.7
(Continued)

FOREIGN PATENT DOCUMENTS

WO       2016046713 A1     3/2016

OTHER PUBLICATIONS

Span, G. et al., "Thermoelectric Power Generation Using Large Area pn-Junctions", Sep. 2005. (Year: 2005).*
(Continued)

*Primary Examiner* — Tamir Ayad
(74) *Attorney, Agent, or Firm* — Thomas | Horstemeyer, LLP

(57) ABSTRACT

Various examples of thin film thermoelectric (TE) devices, their fabrication and applications are presented. In one example, a thin film TE device includes a first substrate including a void; a p-type TE element attached to the first substrate at a first end and extending over the void to a second end; an n-type TE element attached to the first substrate at a first end and extending over the void to a second end adjacent to the second end of the p-type TE element; and an interconnection coupling the second ends of the p-type TE element and the n-type TE element. In some examples, TE device layers can be vacuum sealed between a supporting substrate and a transparent substrate. A thermal spreader can include TE modules having a distribution of TE elements that operate in generating or cooling modes to cool IC or device hotspots using self-generated power.

21 Claims, 34 Drawing Sheets

(51) Int. Cl.
    *H01L 35/30*     (2006.01)
    *H01L 35/32*     (2006.01)

(56)           References Cited

U.S. PATENT DOCUMENTS

| | | | |
|---|---|---|---|
| 8,283,553 | B1 | 10/2012 | Yap et al. |
| 2008/0271772 | A1 | 11/2008 | Leonov et al. |
| 2009/0260667 | A1 | 10/2009 | Chen et al. |
| 2011/0214707 | A1* | 9/2011 | Suzuki .................... H01L 35/30 |
| | | | 136/205 |
| 2015/0162517 | A1* | 6/2015 | Kasichainula ...... H01L 31/0525 |
| | | | 136/211 |
| 2017/0040522 | A1* | 2/2017 | Yamashita .............. H01L 35/10 |

OTHER PUBLICATIONS

International Search Report dated Oct. 18, 2018.
João Paulo Carmo, Luis Miguel Goncalves, Reinoud F. Wolffenbuttel, José Higino Correia, A planar thermoelectric power generator for integration in wearable microsystems, Sensors and Actuators A: Physical, 161, (May 2010) 199-204.
M. Strasser, R. Aigner, C. Lauterbach, T.F. Sturm, M. Franosch, G. Wachutka, Micromachined CMOS thermoelectric generators as on-chip power supply, Sensors and Actuators A 114 (Jan. 2004) 362-370.

* cited by examiner

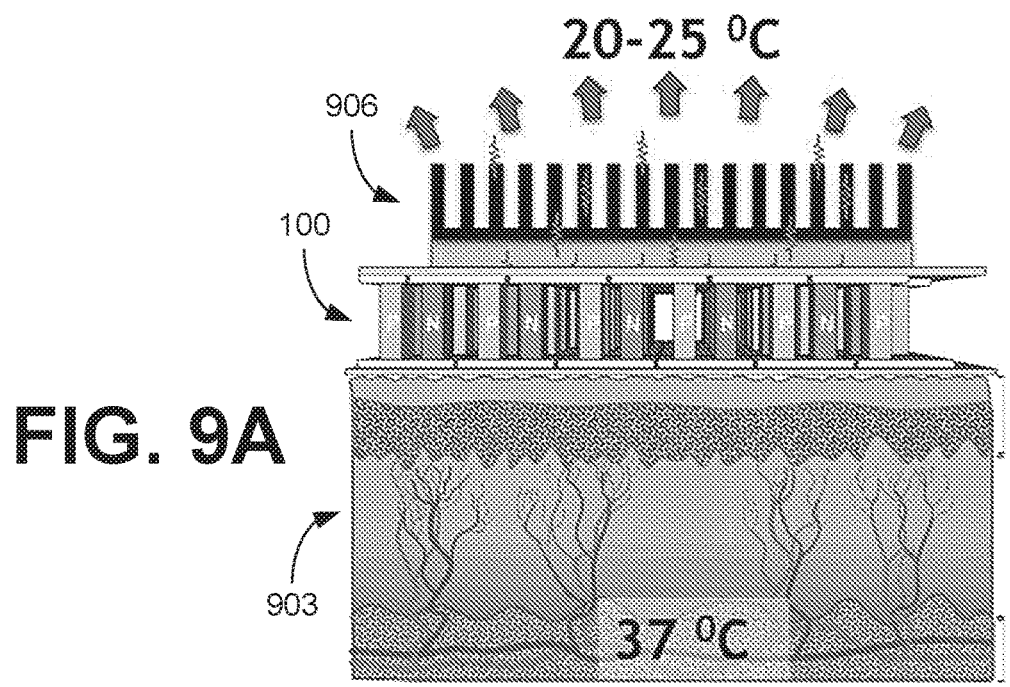
FIG. 9A
FIG. 9B
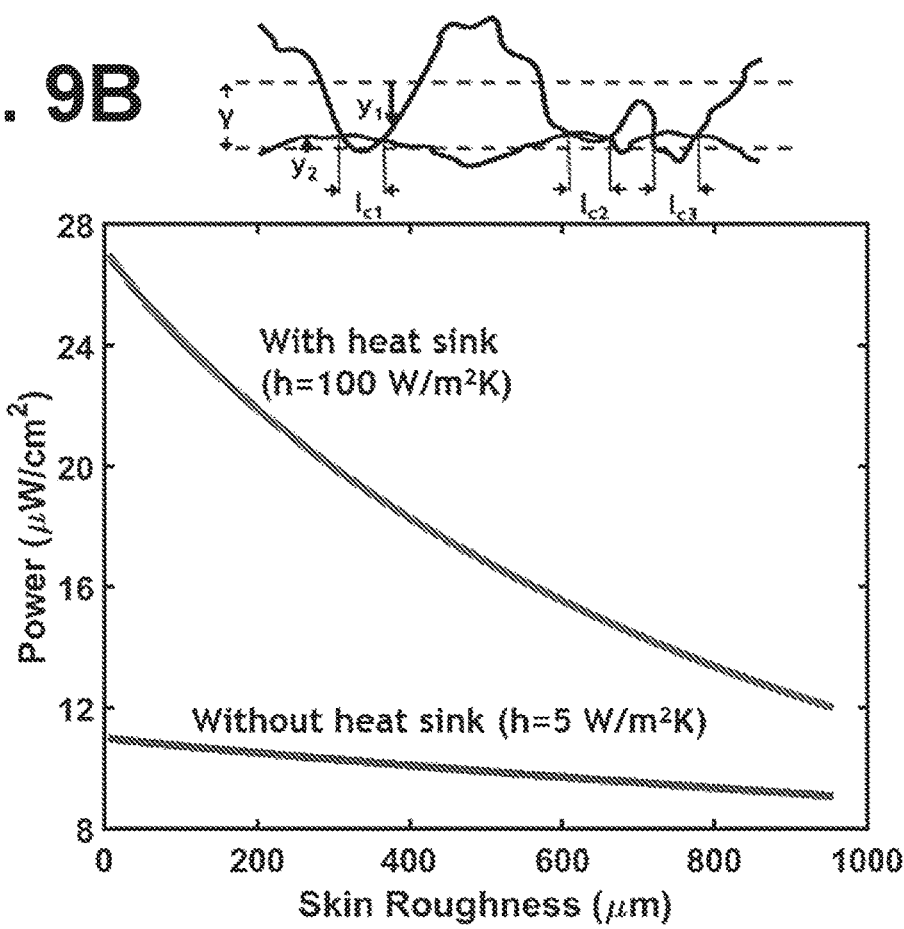
FIG. 9C

| SPEC applicationsV | Energy harvested by TE generators (J) | Energy needed by TE coolers below 70 °C (J) |
|---|---|---|
| 400.perlbench | 20.0 | 8 |
| 401.bzip2 | 24.2 | 12 |
| 403.gcc | 16.4 | 4 |
| 429.mcf | 18.3 | 0 |
| 445.gobmk | 22.5 | 10 |
| 456.hmmer | 26.2 | 12 |
| 458.sjeng | 22.3 | 10 |
| 462.libquantum | 31.1 | 15 |
| 464.h264ref | 30.1 | 15 |
| 471.omnetpp | 14.2 | 0 |
| 473.astar | 18.2 | 0 |
| 483.xalancbmk | 7.2 | 0 | ly # THIN FILM THERMOELECTRIC GENERATOR

CROSS-REFERENCE TO RELATED APPLICATION

This application is the 35 U.S.C. § 371 national stage application of PCT Application No. PCT/US2018/034600, filed May 25, 2018, which claims priority to, and the benefit of, U.S. provisional application entitled "Thin Film Thermoelectric Generator" having Ser. No. 62/511,938, filed May 26, 2017, both of which are hereby incorporated by reference in their entireties.

STATEMENT REGARDING FEDERALLY SPONSORED RESEARCH OR DEVELOPMENT

This invention was made with government support under grant number 1160483 awarded by the National Science Foundation. The government has certain rights to this invention.

BACKGROUND

Devices that harvest energy from a human body can be classified into two groups of active and passive harvesters. Active harvesters, such as piezoelectrics, generate power from the movement of the person wearing the device (e.g., walking, moving, pedaling, specific exercise activity, etc.). In contrast, passive harvesters do not need the person to do any task or movement. Thermoelectric generators (TEGs) are passive harvesters that can constantly harvest energy from the heat produced by the body. TEGs are solid state devices that convert heat flux (or temperature difference) directly into electrical energy. Bulk TE devices have been more commonly pursued mainly due to their ease of fabrication for proof of concept demonstration and higher efficiency of the TE generator when fabricated from bulk materials. However, these TE devices utilize significantly thicker films than typical electronic devices to work efficiently, which is difficult and costly to achieve using the conventional vacuum deposition techniques. To date, no work has been reported on successfully fabricating a commercial thin film TE device with standard micro-fabrication techniques.

SUMMARY

Aspects of the present disclosure are related to thin film thermoelectric (TE) devices (generators and/or coolers), their fabrication and application. For example, thin film TE elements can be used to form TE generators (TEGs) that can harvest energy from temperature differences or TE coolers (TECs) that can remove heat from a circuit or device. Thermal spreaders can also utilize a combination of TE generators and TE coolers for adaptive integrated active cooling and hotspot mitigation in integrated circuits or other devices.

In one aspect, among others, a thin film thermoelectric (TE) device (e.g., generator or cooler) comprises a first substrate comprising a void; a p-type TE element attached to the first substrate at a first end and extending over the void to a second end; an n-type TE element attached to the first substrate at a first end and extending over the void to a second end adjacent to the second end of the p-type TE element; and an interconnection coupling the second end of the p-type TE element to the second end of the n-type TE element, the interconnection attached to a second substrate positioned over the p-type and n-type TE elements opposite the void. In one or more aspects, the TE device can be a TE generator (TEG) or a TE cooler (TEC). The first substrate can be on a hot side of the thin film TE device and the second substrate is on a cold side of the thin film TE device. The p-type and n-type TE elements can be flat TE elements forming a planar structure across the void of the first substrate. The p-type and n-type TE elements can extend at a fixed angle away from the first substrate toward the second substrate, the p-type and n-type TE elements forming an air bridge structure across the void of the first substrate. A length of the p-type and n-type TE elements from the first end to the second end can be greater than a perpendicular distance between the first and second substrates.

In various aspects, the thin film TE device can comprise a second p-type TE element attached to the first substrate at a first end and extending over the void to a second end, the second p-type TE element adjacent to and substantially parallel with the first n-type TE element; a second n-type TE element attached to the first substrate at a first end and extending over the void to a second end adjacent to the second end of the second p-type TE element, the second n-type TE element adjacent to and substantially parallel with the first p-type TE element; and a second interconnection coupling the second end of the second p-type TE element to the second end of the second n-type TE element, the second interconnection attached to the second substrate. The thin film TE device can comprise a third interconnection coupling the first end of the first p-type TE element to the first end of the second n-type TE element or the first end of the first n-type TE element to the first end of the second p-type TE element.

In some aspects, the thin film TE device can comprise a second void in the first substrate; a second p-type TE element attached to the first substrate at a first end and extending over the second void to a second end; a second n-type TE element attached to the first substrate at a first end and extending over the second void to a second end adjacent to the second end of the second p-type TE element; and a second interconnection coupling the second end of the second p-type TE element to the second end of the second n-type TE element, the second interconnection attached to the second substrate. The thin film TE device can comprise a third interconnection coupling the first end of the first p-type TE element to the first end of the second n-type TE element or the first end of the first n-type TE element to the first end of the second p-type TE element. The p-type and n-type TE elements can be vacuum sealed between the first and second substrates. The vacuum can be sealed between the first and second substrates by an epoxy disposed between edges of the first and second substrates. Various TE materials (e.g., n and p doped SiGe or Si, or $(Bi,Sb)_2Te_3$ and $Bi_2(Te,Se)_3$) can be utilized as the p-type and n-type TE elements depending on the working condition such as, e.g., temperature. The p-type and n-type TE elements can comprise doped SiGe or doped Si. The p-type TE element can comprise $(Bi,Sb)_2Te_3$ and the n-type TE element can comprise $Bi_2(Te,Se)_3$.

In another aspect, a thin film thermoelectric (TE) device (e.g., generator or cooler) comprises a first substrate comprising a void; a first p-type TE element attached to the first substrate at a first end and extending over the void to a second end having a first interconnection disposed thereon; a first n-type TE element attached to the first substrate at a first end and extending over the void to a second end adjacent to the second end of the first p-type TE element, the second end of the first n-type TE element having a second interconnection disposed thereon; a second n-type TE element disposed on the first p-type TE element, the second n-type TE element extending from a first end adjacent to the first end of the first p-type TE element to a second end coupled to the second end of the first p-type TE element by the first interconnection; and a second p-type TE element disposed on the first n-type TE element, the second p-type TE element extending from a first end adjacent to the first end of the first n-type TE element to a second end coupled to the second end of the first n-type TE element by the second interconnection; wherein the second ends of the first and second p-type TE elements and the first and second n-type TE elements are attached to a second substrate positioned over the p-type and n-type TE elements opposite the void. In one or more aspects, the TE device can be a TE generator (TEG) or a TE cooler (TEC). The thin film TE device can comprise a third p-type TE element disposed on the second n-type TE element, the third p-type TE element extending from a first end adjacent to the first end of the second n-type TE element to a second end adjacent to the second end of the second n-type TE element, the first end of the third p-type TE element coupled to the first end of the second n-type TE element by a third interconnection; and a third n-type TE element disposed on the second p-type TE element, the third n-type TE element extending from a first end adjacent to the first end of the second p-type TE element to a second end adjacent to the second end of the second p-type TE element, the first end of the third n-type TE element coupled to the first end of the second p-type TE element by a fourth interconnection.

In various aspects, the thin film TE device can comprise a third p-type TE element attached to the first substrate at a first end and extending over the void to a second end, the third p-type TE element adjacent to and substantially parallel with the first n-type TE element; a third n-type TE element attached to the first substrate at a first end and extending over the void to a second end adjacent to the second end of the third p-type TE element, the third n-type TE element adjacent to and substantially parallel with the first p-type TE element; and a third interconnection coupling the first end of the third p-type TE element to the first end of the first n-type TE element. The thin film TE device can comprise a fourth n-type TE element disposed on the third p-type TE element, the fourth n-type TE element extending from a first end adjacent to the first end of the third p-type TE element to a second end coupled to the second end of the third p-type TE element by a fourth interconnection, the fourth n-type TE element adjacent to and substantially parallel with the second p-type TE element; and a fourth p-type TE element disposed on the third n-type TE element, the fourth p-type TE element extending from a first end adjacent to the first end of the third n-type TE element to a second end coupled to the second end of the third n-type TE element by a fifth interconnection, the fourth p-type TE element adjacent to and substantially parallel with the second n-type TE element; wherein the second ends of the third and fourth p-type TE elements and the third and fourth n-type TE elements are attached to the second substrate. The second substrate can be transparent.

In another aspect, a photo enhanced thermoelectric generator (PTEG) comprises a first plurality of thin film thermoelectric (TE) element pairs forming a first TEG layer, each of the first plurality of thin film TE element pairs comprising a p-type thin film TE element coupled to an n-type thin film TE element; a second plurality of thin film thermoelectric (TE) element pairs forming a second TEG layer disposed on the first TEG layer, each of the second plurality of thin film TE element pairs comprising a p-type thin film TE element coupled to an n-type thin film TE element, where the p-type thin film TE elements of the second plurality of thin film TE element pairs are disposed on the n-type thin film TE elements of the first plurality of thin film TE element pairs and the n-type thin film TE elements of the second plurality of thin film TE element pairs are disposed on the p-type thin film TE elements of the first plurality of thin film TE element pairs thereby forming photosensitive vertical depletion regions; wherein the first and second TEG layers are vacuum sealed between a first supporting substrate and a second transparent substrate. In one or more aspects, the first and second TEG layers can form a plurality of concentric rings of alternating thin film TE element pairs.

In another aspect, a thermal spreader comprises a TE layer comprising an array of TE modules including a distribution of TE elements, the TE modules of the array configured to operate in a generating mode or a cooling mode; and at least one multiplexer (MUX) configured to control operation of the TE modules of the array based upon hotspot sensing. In one or more aspects, the at least one MUX can control operation of the TE modules of the array in response to a comparison of sensed temperature of an integrated circuit or device adjacent to the TE layer. The TE modules of the array can comprise at least one temperature sensor. The at least one temperature sensor can comprise a pair of TE elements in the distribution of TE elements. The TE layer can be disposed between an integrated circuit or device and a heat sink. The distribution of TE elements can be formed in a multi-ring self-sealed structure. The TE modules of the array operating in the generating mode can supply power to one or more TE modules of the array operating in the cooling mode. The at least one MUX can adjust the operation of the TE modules in response to changes in sensed hot spot temperatures.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 9A through 9C illustrates the performance of conventional TE devices positioned on the skin, in accordance with various embodiments of the present disclosure.

DETAILED DESCRIPTION

Figure 1A:
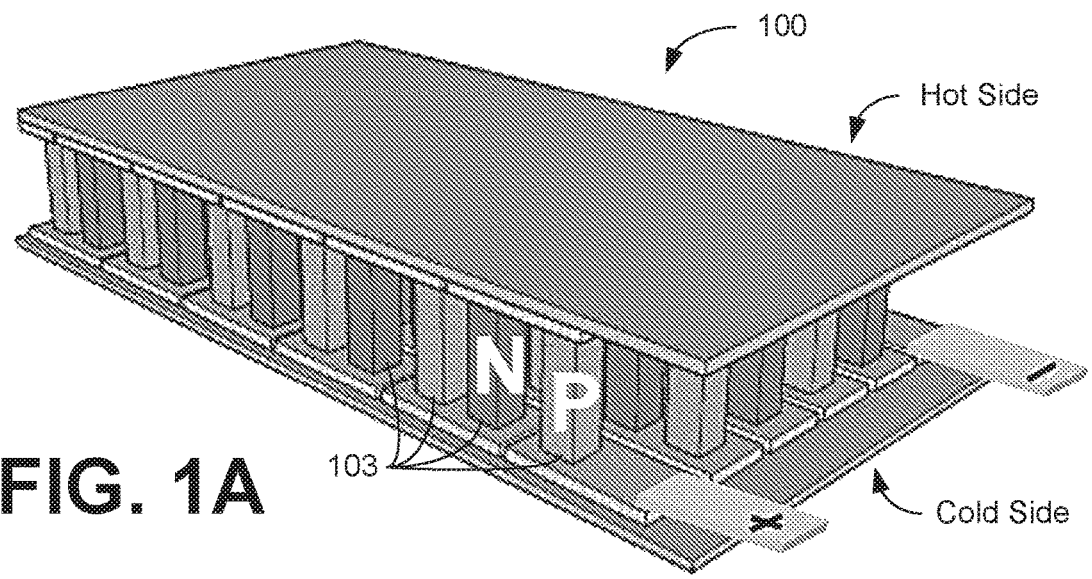
FIGS. 1A and 1B are graphical representations of an example of a conventional thermoelectric (TE) device with a vertical structure.

Disclosed herein are various embodiments related to thin film thermoelectric devices (e.g., generators and/or coolers), their fabrication and application. Reference will now be made in detail to the description of the embodiments as illustrated in the drawings, wherein like reference numbers indicate like parts throughout the several views.

There are many commercial applications of thin-film thermoelectric generators (TEGs). However, the emergence of wearable electronics presents a clear opportunity for quick market entry. TEGs can convert body heat to electrical energy providing a continuous source of energy to power sensors and electronics. The world's growing fascination with performance monitoring has brought the wearables market from heavy powered vests developed in the 1980s to seemingly ubiquitous wristband pedometers and activity monitors. Watches, belts, headbands, cuffs, smart jewelry, and smart textiles can all provide platforms for monitoring the health, wellness and immediate environment of a user. The benefits of networks made with small self-powered devices are truly revolutionary. Beyond the early applications of activity monitors and pedometers, digital and connected mobile health promises to revolutionize the planning and delivery of medical care and empower health teams to support patient monitoring and recovery. Rather than snapshots of patient health, healthcare teams can greatly increase the detail of evaluation and understand the complex interplay of many health and wellness parameters both across a patient's illness and across populations.

Small and lightweight TEGs can be integrated into wearable devices making continuous, long-term monitoring a reality. A large fraction of the users stops using their wearables after a few months, which may be attributed to several factors such as limited information provided by these devices (e.g., counting the steps) and the need for frequent charging. A solution can be provided by increasing the number of sensors on the devices to increase their functionality and making the devices self-powered eliminating the need for recharging or replacing the batteries. This would also enable the use of wearables in clinical applications. For instance, self-powered devices would allow doctors to monitor the state of their elderly patients after they are discharged from the hospital. In addition to wellness and health monitoring, connected networks of self-powered sensors could inform decisions in industrial manufacturing, precision agriculture, environmental monitoring, surveying and civil engineering, and of course smart and connected homes.

There has been significant progress in the development of thermoelectric (TE) materials with improved figures-of-merit. Good thermoelectric (TE) materials feature low thermal conductivity, $\kappa$, high electrical conductivity, $\sigma$, and high Seebeck coefficient, S. These properties are combined in a dimensionless figure-of-merit (zT) given by $zT=S2\sigma T/\kappa$, where T is the temperature in Kelvin. The commercial TE modules operate with zT about 0.8. For reference, zT of about 1.5 represents a significant improvement, while zT of about 2 is a breakthrough. So far, the TE community has had mainly a single goal: to improve the figure-of-merit zT. To achieve this goal, researchers have worked both on bulk and thin-film materials. While bulk materials are suitable for high power applications such as waste heat recovery in cars or for powering space crafts, thin films are more favorable for low power applications where compactness and small weight can be very important, such as for wearable electronics, remote sensing applications, and the emerging Internet-of-Things (IoT).

This progress offers great prospects for developing thin film TE devices for energy harvesting, heating, and cooling. Thin film TE devices use significantly less material than bulk TE devices and can be manufactured with standard micro-fabrication techniques. The smaller weight of the thin film TE device can also reduce the cost of assembly and installation. As a result, they are more cost-effective for large-scale production. In addition, it is possible to fabricate a thin film TE device with a large number of TE elements (e.g., $10^4$ elements), which means that a TE device with higher output voltage can be realized. However, TE devices with improved efficiency are rarely reported.

Thermoelectric modules fabricated to date are not yet fully compatible with wearable applications and, often, they cannot produce sufficient electrical energy to power the sensors and the electronics. There are challenges both at the device and system levels for realization of efficient body heat harvesters as briefly discussed below:

At the device level, a large zT does not always result in high power. Indeed, small thermal conductivity can be more important than zT for wearable TEGs. This is mainly due to the large thermal resistance of the skin as well as the small and inefficient heatsink used on top of the TEG to keep a small form factor. Therefore, a large thermal resistance in the device can maintain a useful temperature differential across the TEG. The conventional thin-film device structure also poses another (and possibly bigger) challenge as the thermal resistance of the device scales with the thickness, which results in a very small temperature differential across a TEG (less than 0.1° C.); hence, the produced power and voltage can be too small for most applications.

At the system level, the output voltage from a wearable TEG based on conventional devices is often too small to turn on the sensors and electronics. The voltage can be boosted (or increased) using a self-powered power management unit (PMU). The efficiency of such boosters depends on the input voltage, such that the higher the input voltage, the higher the efficiency. For example, the PMU efficiency can be in a range from about 10% to about 60%, where the efficiency is small for small voltages (e.g., about 10% for 20 mV). With at TEG output of 20-100 mV, the PMU can provide greater than 1V to the sensors and electronics. Therefore, a TEG with a large output voltage is desirable. The overall system efficiency depends on the voltage (and not just the power) generated by the TEG. Indeed, the PMU does not even turn on if the voltage is below a threshold (e.g., about a few mV such as 10 mV).

Figure 1B:
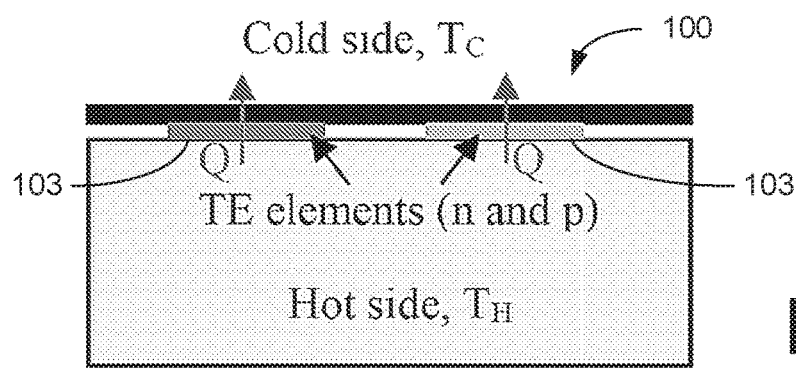

Referring to FIGS. 1A and 1B, shown are graphical illustrations of an example of a conventional TE device 100 with a vertical structure. As illustrated in FIG. 1A, the TE device 100 is made of N and P-type elements 103 that are vertically located between the hot and cold sides of the device (top and bottom). The N and P-type elements 103 are electrically in series but thermally in parallel separating the hot and cold sides. The thickness for a thin-film TEG is very small, which poses both technical and fundamental challenges. On the technical side, micro-fabrication techniques for batch processing of TE devices have primarily suffered from low yield and poor metal contacts that have limited their progress. As shown in FIG. 1B, the hot and cold sides are connected through the small thickness of the film, which results in a short vertical path length for the heat flux (Q) across the thin film elements 103 and thus a small temperature differential ($\Delta T$).

On the fundamental side, there are two efficiency limiting factors. The first limitation is the high sensitivity of the device to contact resistances. The ohmic contact resistance ($R_{oc}$) must be small compared to the resistance of the TE element ($R_{TE}$), i.e. $R_{oc} \ll R_{TE}$. This condition dictates that $l \gg \rho_{oc}/\rho_{TE}$, in which l is the length of the TE element, $\rho_{oc}$ is the specific ohmic contact resistance, and $\rho_{TE}$ is the resistivity of the TE material. Since TE materials are usually highly doped, $\rho_{TE}$ is small typically in the range of $\rho_{TE} < 10\text{-}3$ $\Omega$-cm. For a typical contact resistance of $10^{-6}$ $\Omega$-cm$^2$, this means that $l \gg 10$ µm. Therefore, thin films in the range of 100 µm thick are desired to make efficient devices.

However, growing such thick films with vacuum deposition techniques is often very expensive and time-consuming. The second limitation is related to the necessary temperature differential, $\Delta T$, between the hot side and cold side of the device. Basically, a larger $\Delta T$ would result in a larger voltage and power. One can increase the $\Delta T$ by increasing the thermal resistance of the TEG and/or increasing the incoming thermal energy. To increase the thermal resistance, a large length to cross-sectional area A, (i.e. l/A) is desired. A is set by the lithography limits, which is typically more than (or in the same range as) the film thickness. Therefore, the solution is to increase l again, so one must grow very thick films.

This disclosure presents new thin film TE devices that can alleviate the need for growing thick films. TE devices employing a quasi-planar thin film device structure can be achieved with standard micro-fabrication techniques, resulting in a large density of TE elements (or legs) per unit area, less consumed material, and cost-effective wafer scale manufacturing method. In particular, the ability to fabricate a large number (e.g., greater than $10^3$ per cm$^2$) of TE elements per unit area enables making thermoelectric generators (TEGs) that can produce large output voltages. The small weight of the thin film TE device reduces the cost of assembly and installation. A method for fabricating such a thin film TE device is disclosed. The method can be extended to include to provide three-dimensional (3D) TEG structures by allowing the stacking of thin film elements to form a 3D construction.

Figure 2:
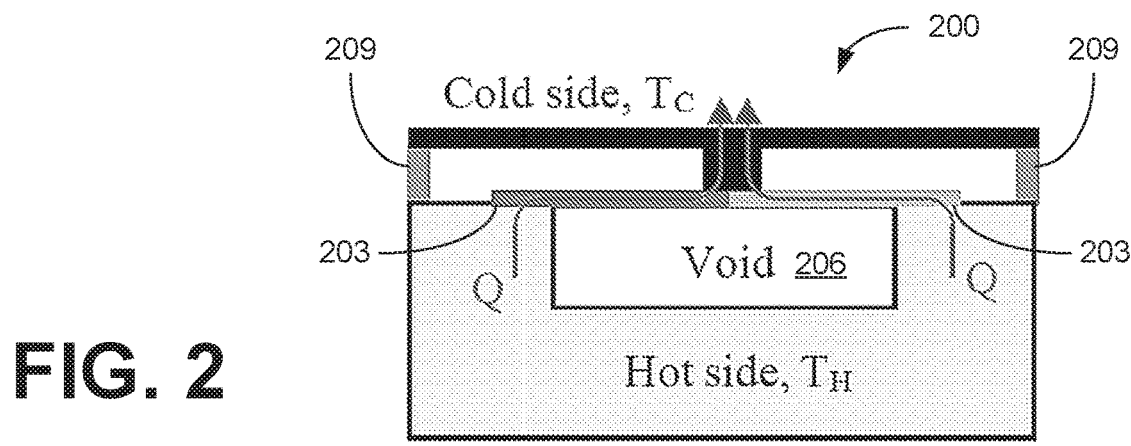
FIG. 2 is a graphical representation of a thin film TE device including planar thin film elements, in accordance with various embodiments of the present disclosure.

Referring now to FIG. 2, shown is a graphical illustration of an example of a thin film TE device 200 including planar thin film elements 203 that extend across a void 206 to a center connection. As depicted in FIG. 2, the hot and cold sides are connected through the horizontal length of the thin film elements 203, which results in a longer path length for the heat flux (Q) and generates a much larger $\Delta T$ across the TE device 200. In the thin film TEG 200 of FIG. 2, unlike the vertical design of FIGS. 1A and 1B where the heat flux (Q) path length of the TE element 100 is the thickness of the film, the heat flux (Q) path length can be flexibly varied independent from the thickness of the film. This feature is very beneficial in thin-film TEGs where increasing the thickness of the film may be too difficult beyond a relatively small value (few micrometers). Moreover, in the planar TE device 200, the thin TE layers enable batch processing of the TE device 200 using conventional microfabrication techniques.

While the planar approach offers a good solution, the large thermal resistance of the TE elements 203 due to a large l/A ratio can pose a challenge. For such a large thermal resistance ($R_{TE}$), parasitic heat losses due to convection (air) become important. Therefore, vacuum sealing of the TE device 200 can make a remarkable difference. For the TE device 200 of FIG. 2, the package can add another parasitic heat conduction path between the hot and cold sides of the TE device 200. This conduction path is through the sealant 206 providing the vacuum sealing.

To achieve this thin film TE device 200, standard microfabrication techniques can be employed including photolithography, wet etch, dry etch, chemical and/or physical vapor deposition. The fabrication method makes the thin film TE device more cost-effective for large-scale production. In addition, it is possible to fabricate a thin film TE device 200 with a large number of TE elements 203 (e.g., $10^4$ elements). Thus a TE device 200 with higher output voltage can be realized. Moreover, the smaller weight of the thin film TE device 200 can reduce the cost of assembly and installation.

Figure 3A:
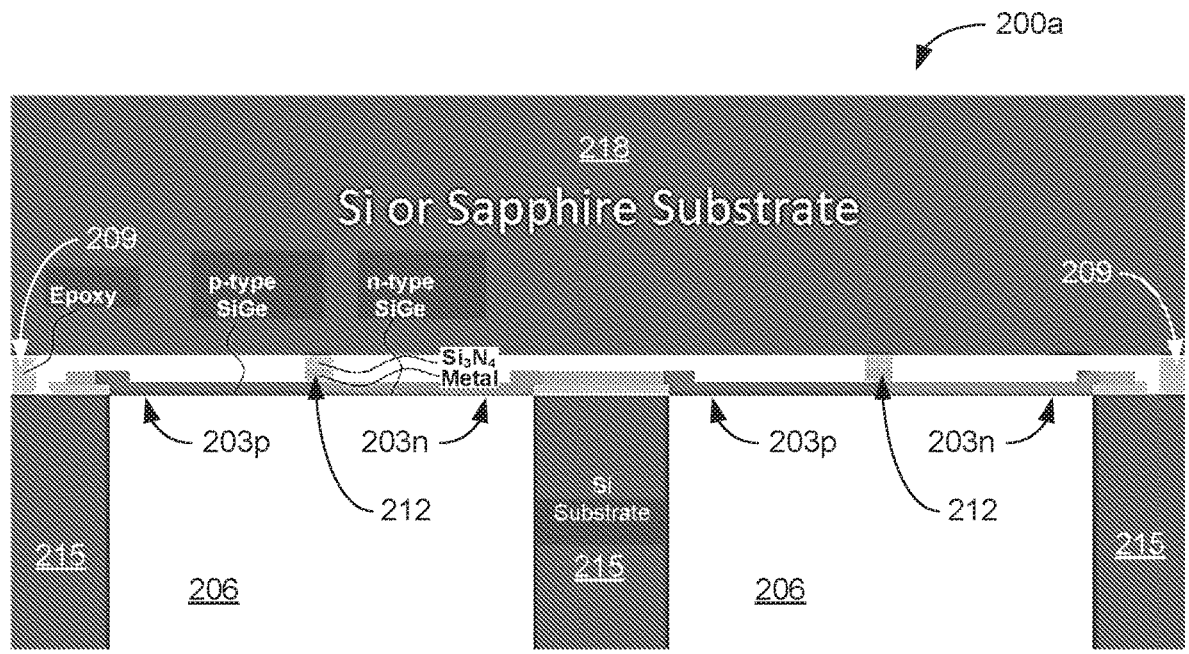
FIGS. 3A-3D are graphical representations of examples of thin film TE devices, in accordance with various embodiments of the present disclosure.

The thin film TE device 200 is composed of pairs of TE elements 203. Each pair of TE elements 203 can be regarded as a single thin film TE device, with those single devices connected in series with each other. FIG. 3A is a schematic cross-sectional view illustrating an example of a thin film TE device 200a with a planar structure. In an actual thin film TE device 200a, the number of TE elements 203 can be determined by several factors such as, but not limited to, desired output voltage, device area, and/or optimal efficiency. In the example of FIG. 3A, the single thin film TE device 200a has a flat structure, which includes p-type SiGe thin film elements 203p, n-type SiGe thin film elements 203n, and interconnection metal 212. For a single pair of TE elements 203, the flat structure comprises a p-type SiGe element 203p, and interconnection metal 212, and n-type SiGe element 203n spanning a void 206 formed in the Si substrate 215. The Si substrate 215 can be etched to expose the SiGe thermoelectric elements 203. The remaining portions of the etched Si substrate 215 act as the cold side. A second substrate 218 (e.g., silicon or sapphire) is bonded to the other side of the TE elements 203, acting as the hot side. The edges of the TEG device 200a are sealed by epoxy 209.

Figure 3B:
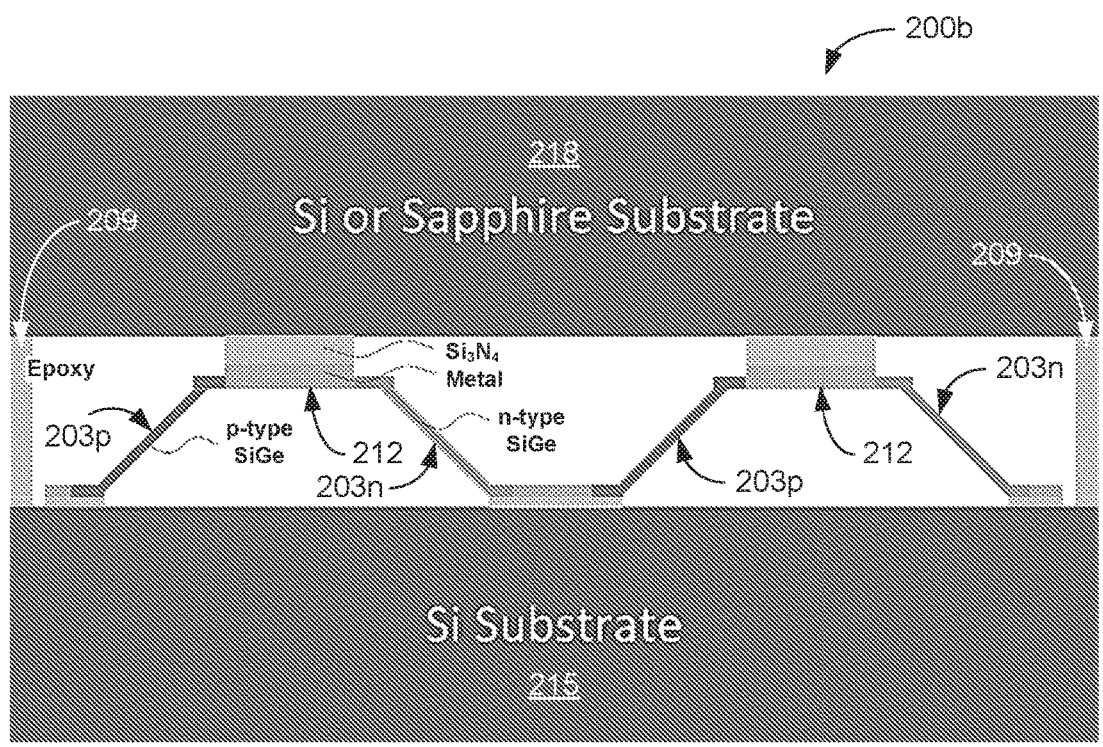

Other configurations of TE elements 203 are also possible. For instance, FIG. 3B shows a schematic cross-sectional view of a thin film TE device 200b with an air bridge structure. In the example of FIG. 3B, two adjacent pairs of thin film TE elements 203 are connected in series with each other. In other TE devices 200, the number of connected TE element pairs 203 could be determined based upon its application. As shown in FIG. 3B, a single air bridge structure comprises a p-type SiGe element 203p, interconnection metal 212, and an n-type SiGe element 203n that bridge a void 206. The bottom of the TE device 200b can be a Si substrate 215, acting as the cold side. A second substrate 218 (e.g., Si or sapphire) is bonded to the air bridge structures, acting as the hot side. The edges of the TE device 200b is sealed by epoxy.

Figure 3C:
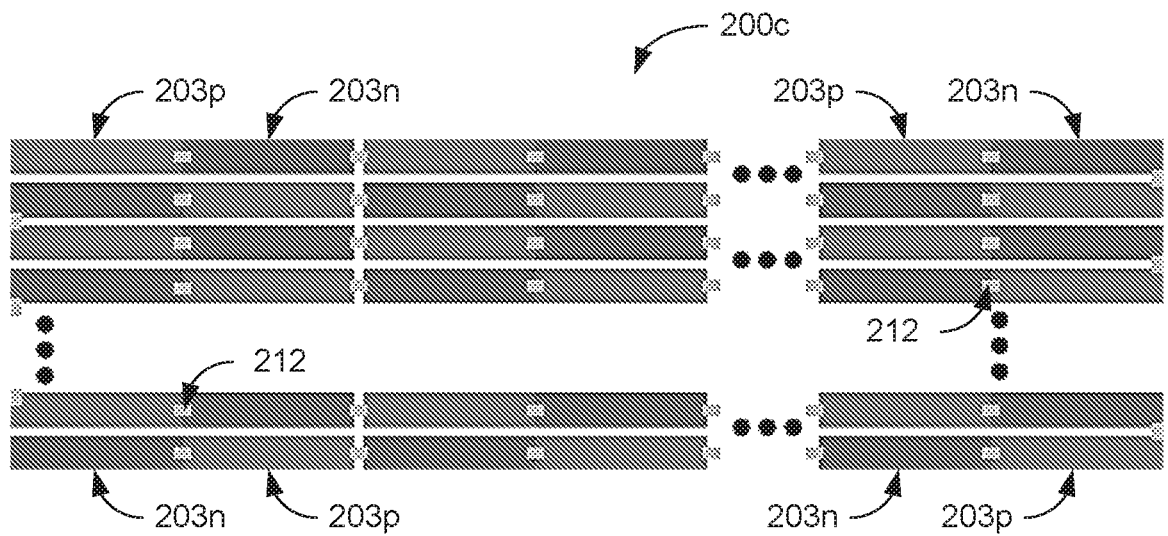

FIG. 3C is a schematic top view illustrating an example of a thin film TE device 200c with a two-dimensional (2D) structure (e.g., square or rectangular). While the TE device 200c includes a top bonding substrate 218 and bottom substrate 215, the substrates are not shown in FIG. 2C for clarity. As mentioned previously, the pairs of thin film TE elements 203 are connected with each other in series. The flat and air bridge structures of the TE devices 200 illustrated in FIGS. 3A and 3B can be employed in the 2D structure of FIG. 3C. The output voltage of the TE device 200c would be the sum of each pair of thin film TE elements 203. Other 2D structures are also possible.

Figure 3D:
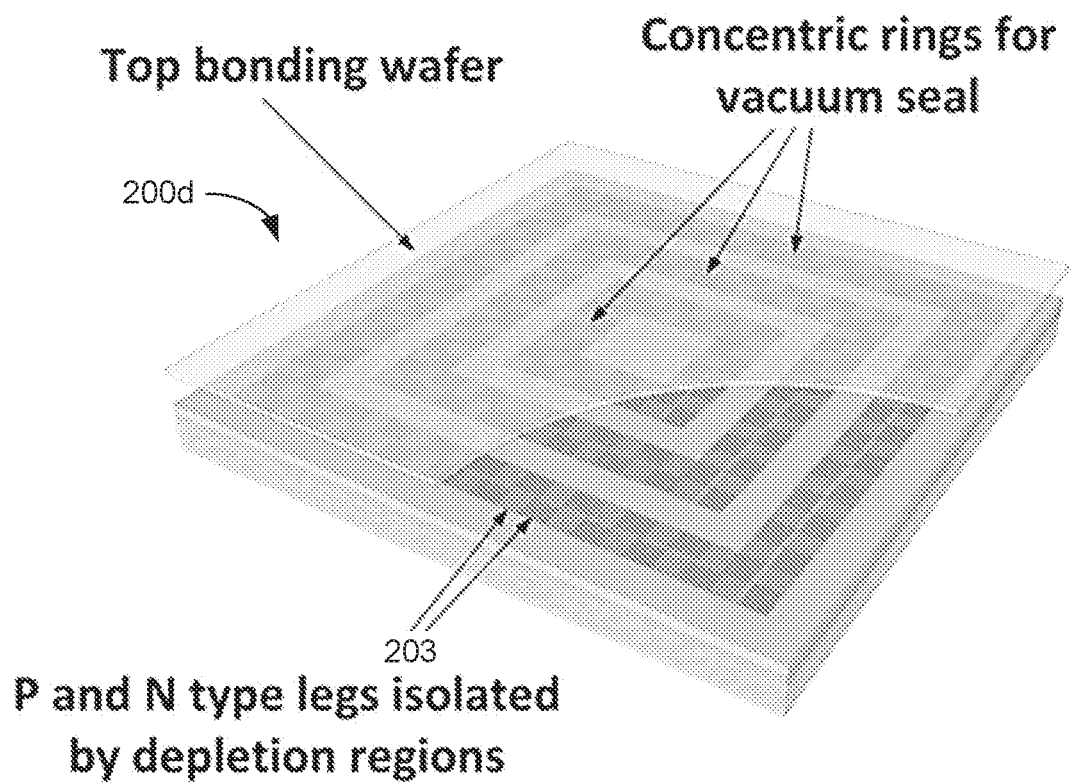

FIG. 3D shows a schematic top view of a thin film TE device 200d with a ring structure. The TE device 200d of FIG. 3D comprises numerous concentric rings made of alternating p-type and n-type TE elements 203 that serve as the TE legs. For clarity, only the first TE layer (without the metal contact 212) is shown. While the TE device 200d shown in FIG. 3D has three rings, in practice, two or more rings can be used depending on the device size. The ring structure of FIG. 3D includes continuous concentric rings enabling vacuum encapsulation. The flat and air bridge structures of the TE devices 200 illustrated in FIGS. 3A and 3B can be employed in the ring structure of FIG. 3C.

A self-vacuum-sealing design is provided where the TE elements 203 are attached in a ring structure and seal the entire TE device 200d. Each ring acts a sealing wall; therefore, the internal rings are sealed multiple times. The sealing is possible because there is no gap between the adjacent TE elements 203 (in contrast to conventional TE devices where the n-type and p-type elements are separated as shown in FIG. 1B). This is possible due to the formation of a depletion region between the p-type and n-type elements 203 that limit the electron and hold transport parallel to the interface. This way, the rings can be made continuous in the 2D plane.

Figure 4:
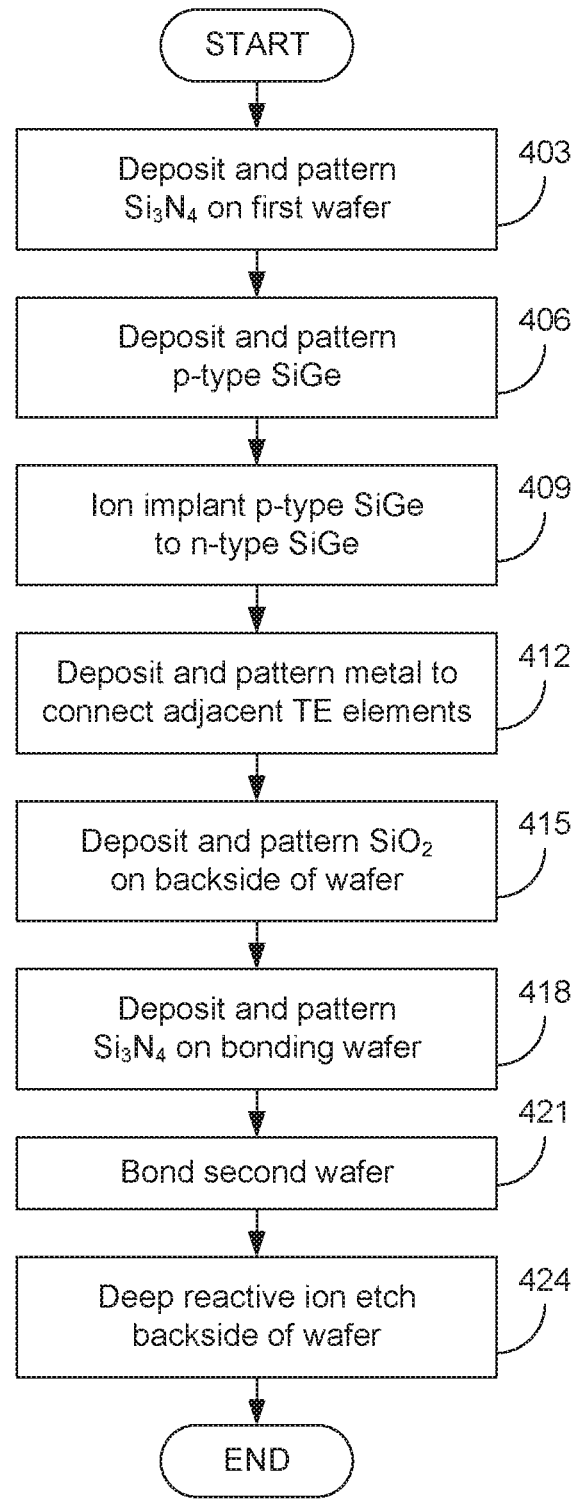
FIGS. 4 through 7J illustrate examples of fabrication processes for thin film TE devices, in accordance with various embodiments of the present disclosure.
Figure 5A:
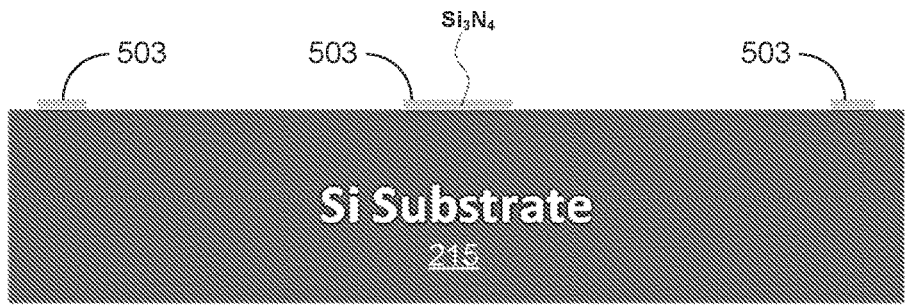

FIG. 4 shows a flowchart illustrating an example of a procedure for fabricating a thin film TE device 200 with a flat structure. The fabrication process is shown for SiGe thermoelectric devices, but it can be adapted for the use of other thin film TE materials such as, e.g., Si and $(Bi,Sb)_2(Se,Te)_3$ based alloys. Beginning at 403, a layer 503 of $Si_3N_4$ can be deposited and patterned on a first wafer (e.g., a Si substrate) 215 as illustrated in FIG. 5A. A layer of photoresist can be patterned on the $Si_3N_4$ layer 503 using, e.g., photolithography. The exposed $Si_3N_4$ can then be dry etched with, e.g., a Fluorine-based plasma and the remaining photoresist removed.

Figure 5B:
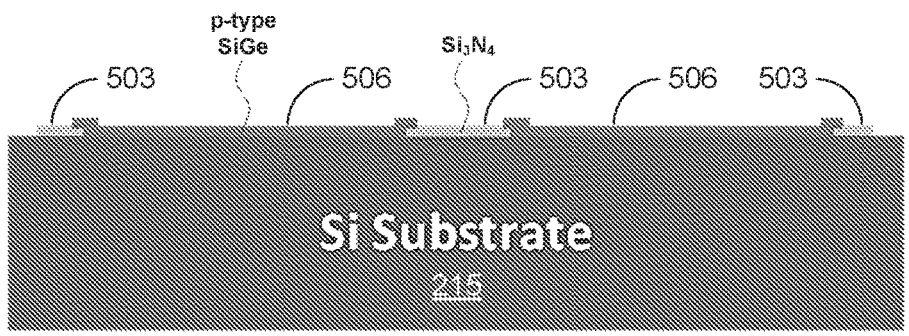
Figure 5C:
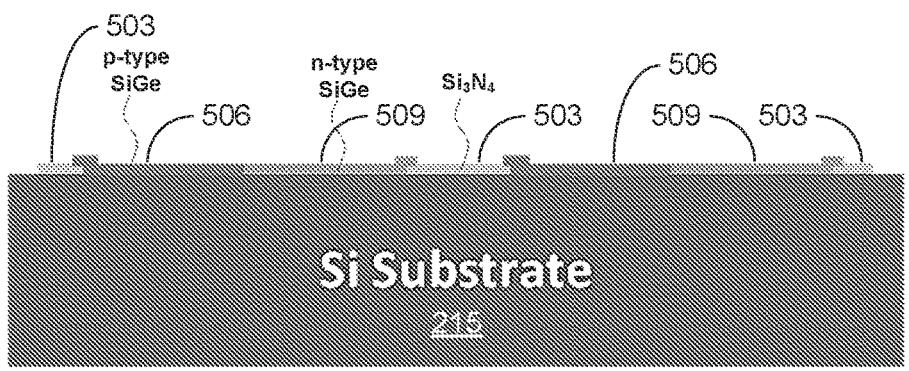
Figure 5D:
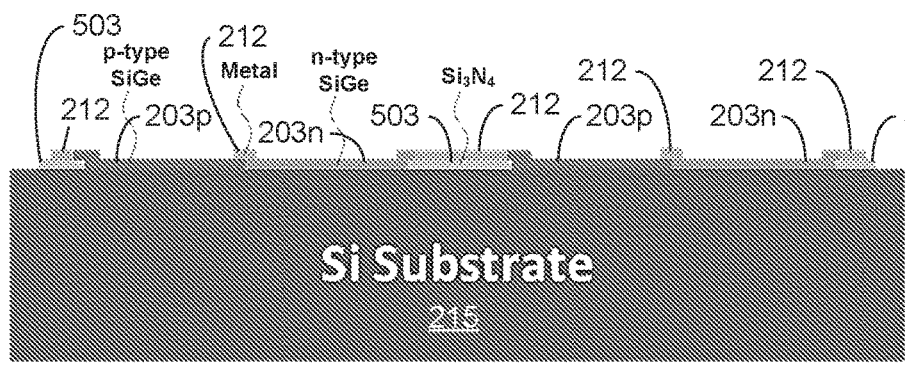
Figure 5E:
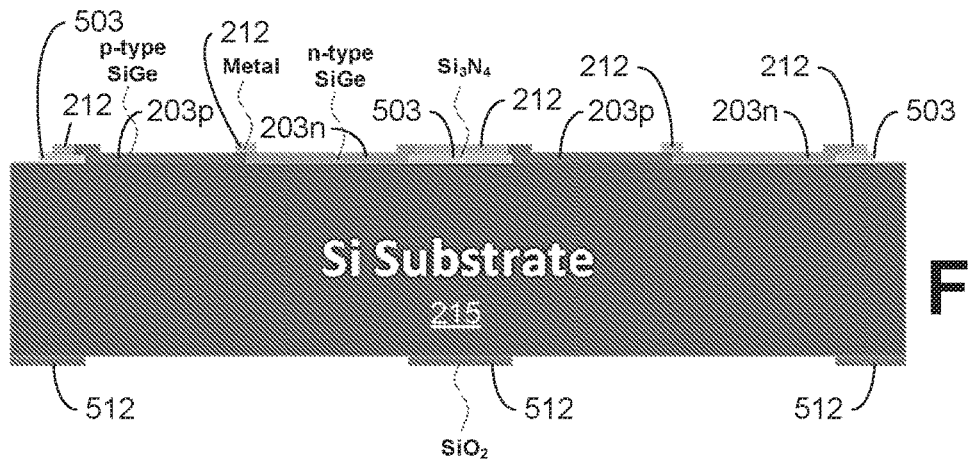

At 406 of FIG. 4, a layer 506 of p-type SiGe can be deposited on the first wafer (or substrate) 215 and patterned (e.g., by photolithography and wet etching), as shown in FIG. 5B. Next, ion implanting of p-type SiGe 506 to n-type SiGe 509 can be carried out at 409, as illustrated in FIG. 5C. The metal interconnects 212 (e.g., titanium) can then be deposited and patterned at 412 to connect adjacent TE elements 203 using, e.g., e-beam evaporation. This is illustrated in FIG. 5D. Some metal interconnects 212 can be deposited over the remaining portions of the $Si_3N_4$ layer 503 to connect adjacent p-type and n-type TE elements 203. Next, at 415, a layer 512 of $SiO_2$ can be deposited and patterned on the backside of the first wafer (or substrate) 215 as illustrated in FIG. 5E. This order may be reversed in some implementations.

Figure 5F:
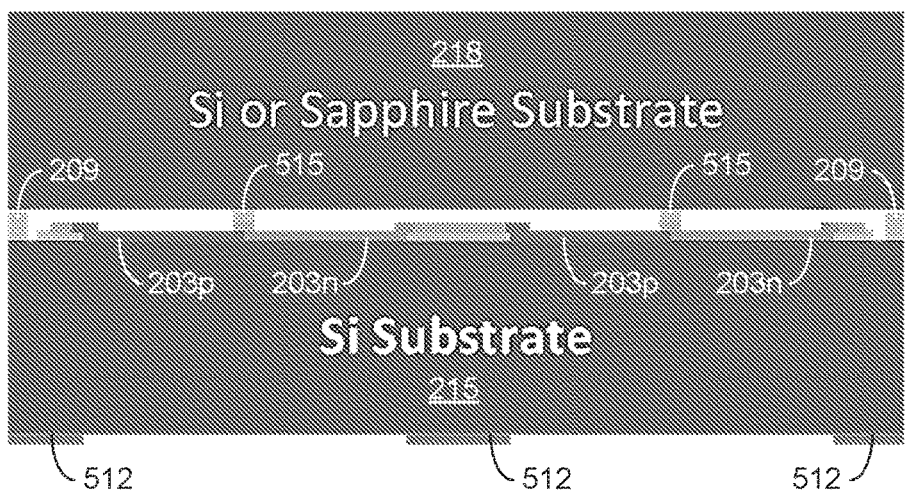
Figure 5G:
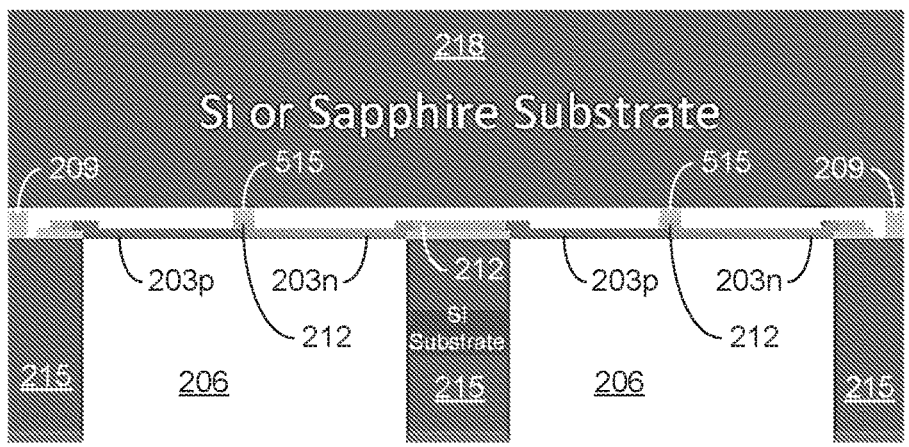

A layer 515 of $Si_3N_4$ (and SU8) can be deposited and patterned on the bonding wafer at 418 and a second wafer (or substrate) 218 can be bonded over the TE elements 203 at 421, as shown in FIG. 5F. As illustrated in FIG. 5F, epoxy 209 can be applied for vacuum sealing of the TE device 200. At 424 of FIG. 4, deep reactive ion etching (DRIE) of the backside of the first wafer 215 can be used to form voids 206 below the pairs of TE elements 203. With the voids 206, the heat flux Q flows between the first and second substrates 215 and 218 along the horizontal length of the TE elements 203.

Figure 6:
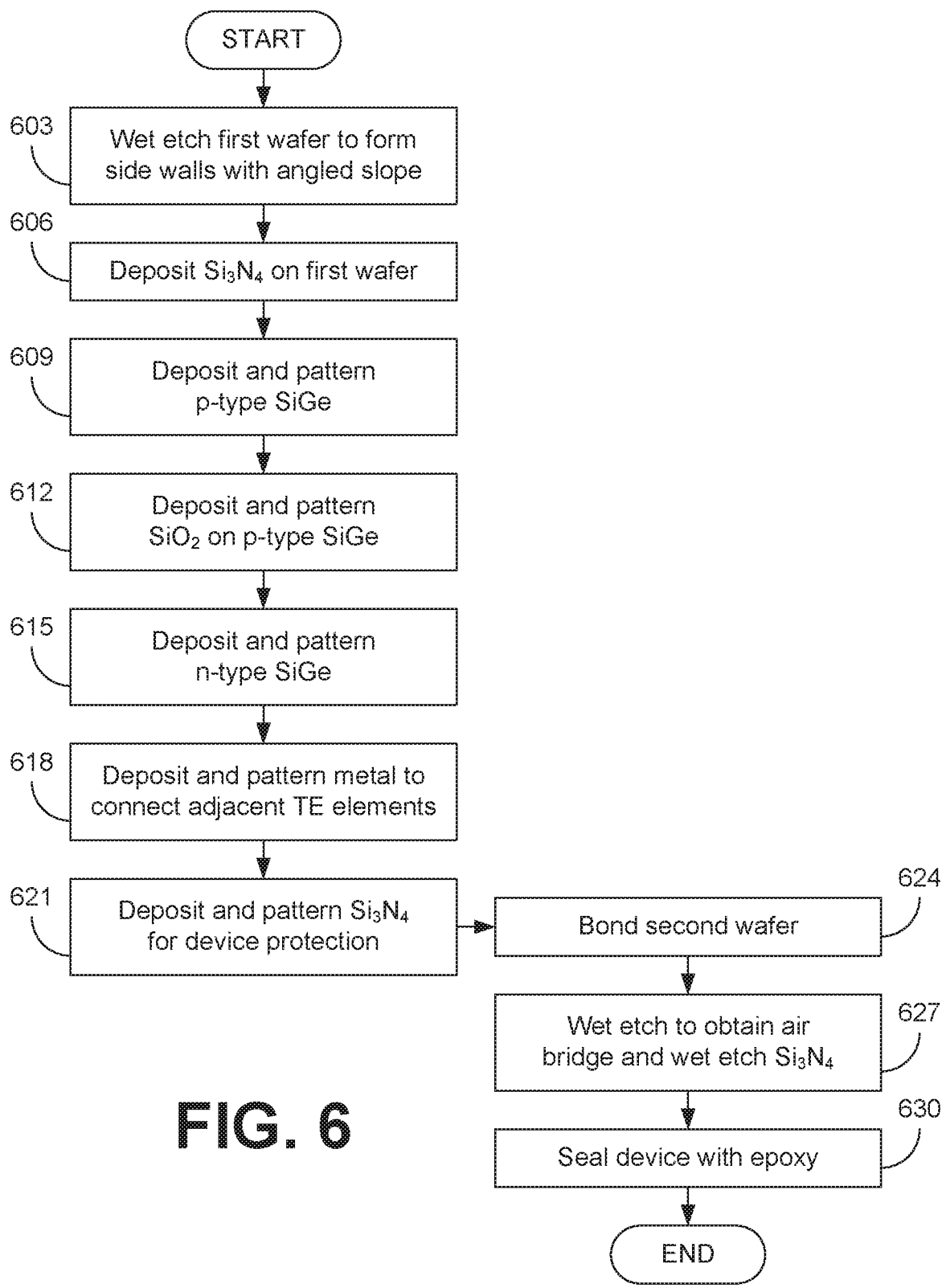
Figure 7A:
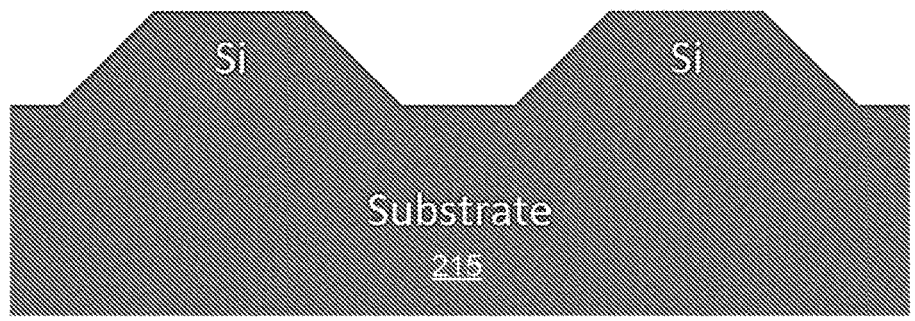

Referring next to FIG. 6, shown is a flowchart illustrating an example of a procedure for fabricating a thin film TE device 200 with an air bridge structure. The fabrication process is shown for SiGe thermoelectric devices, but it can be adapted for the use of other thin film TE materials such as, e.g., Si and $(Bi,Sb)_2(Se,Te)_3$ based alloys. Beginning at 603, a first wafer (e.g., a Si substrate) 215 can be water etched to form side walls with an angled slope, as illustrated in FIG. 7A. For example, a layer of $Si_3N_4$ can be deposited on a Si wafer as a wet etch mask. Then, a layer of photoresist can be patterned by photolithography. Next, the non-protected $Si_3N_4$ can be dry etched with a fluorine-based plasma, and the remaining photoresist removed after the dry etch. Later, the Si wafer can be wet etched in a hot potassium hydroxide (KOH) solution until the desired etch depth (e.g., 400 μm) is reached. Finally, the remaining $Si_3N_4$ can be removed with fluorine-based plasma; thus, the etched side walls with the angled slope can be obtained.

Figure 7B:
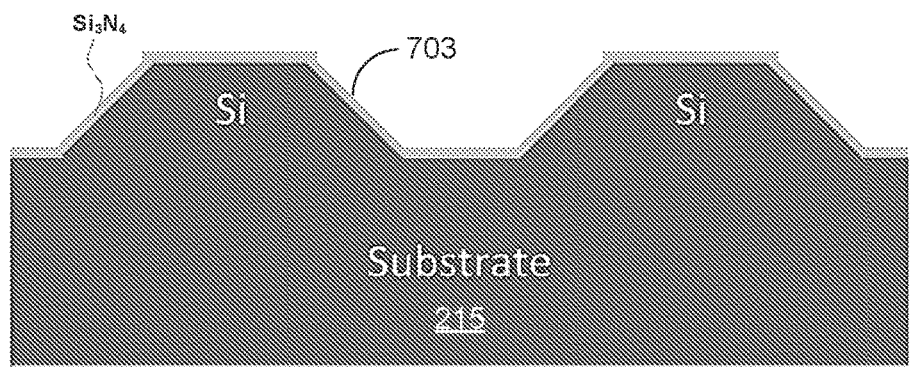
Figure 7C:
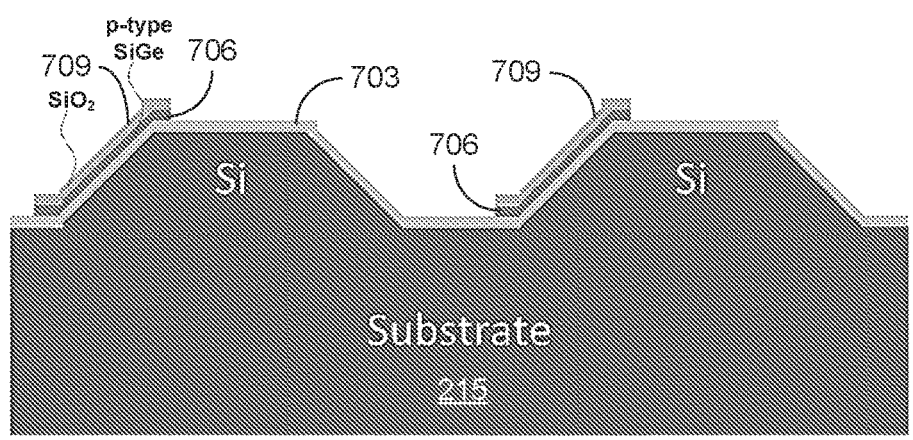

After the first wafer (or substrate) 215 is shaped, a layer 703 of $Si_3N_4$ can be deposited on the first wafer 215 at 606 of FIG. 6, as illustrated in FIG. 7B. Next, a layer 706 of p-type SiGe can be deposited and patterned at 609, followed by deposition and patterning of $SiO_2$ on p-type SiGe at 612, as shown in FIG. 7C. Other combinations of deposition and patterning can be used. For example, the layer 706 of p-type SiGe can first be deposited on the $Si_3N_4$ layer 703, and the layer 709 of $SiO_2$ can then be deposited on top of p-type SiGe. The $SiO_2$ layer 709 can be patterned by photolithography, and wet etch, followed by patterning the p-type SiGe 706 with, e.g., $SiO_2$ as wet etch mask in a mixture of hydrofluoric acid, nitric acid, and acetic acid (HNA).

Figure 7D:
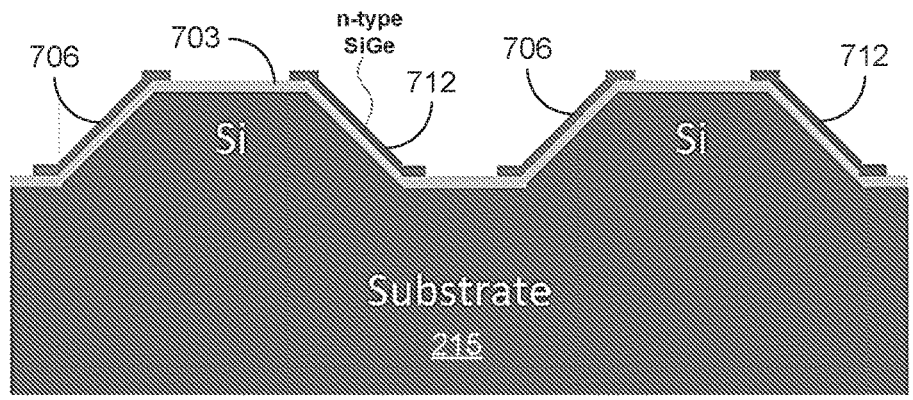
Figure 7E:
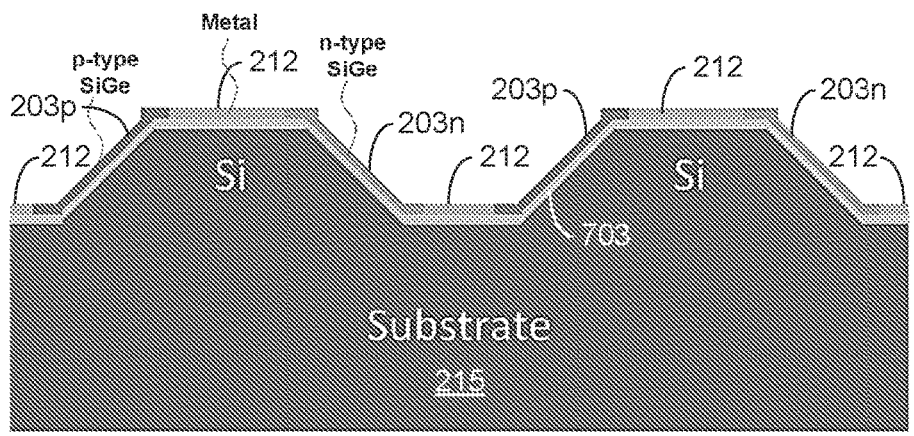

At 615 of FIG. 6, a layer 712 of n-type SiGe can be deposited and patterned, as illustrated in FIG. 7D. For example, the layer 712 of n-type SiGe can first be deposited, and a layer of $SiO_2$ can be deposited on top of n-type SiGe. Then, the $SiO_2$ layer can be patterned by, e.g., photolithography and wet etch. Next, the n-type SiGe can be patterned with the $SiO_2$ as the wet etch mask in, e.g., a mixture of hydrofluoric acid, nitric acid, and acetic acid (HNA). The remaining $SiO_2$ can be removed from on top of the p-type and n-type SiGe using, e.g., a buffered oxide etch (BOE). Metal 212 can be deposited and patterned at 618 to connect adjacent TE elements 203. As shown in FIG. 7E, the interconnection metal (e.g., titanium) can be deposited between the p-type SiGe elements 203p and n-type SiGe elements 203n with, e.g., an e-beam evaporation tool and can be patterned using, e.g., a lift-off technique.

Figure 7F:
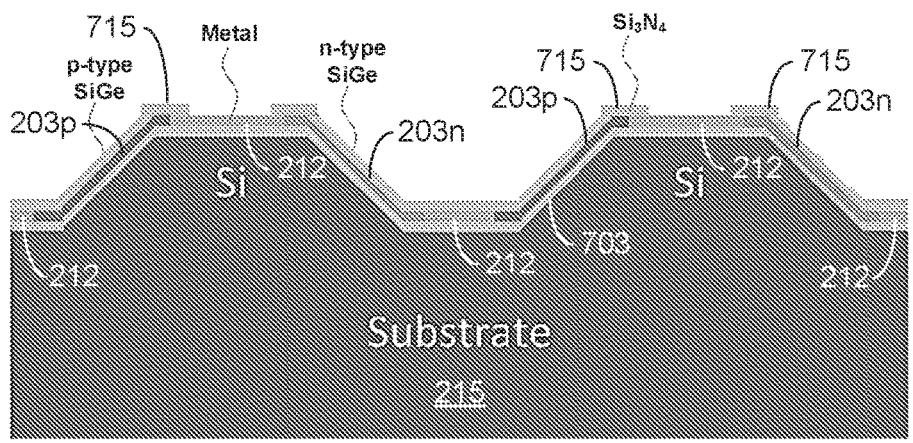
Figure 7G:
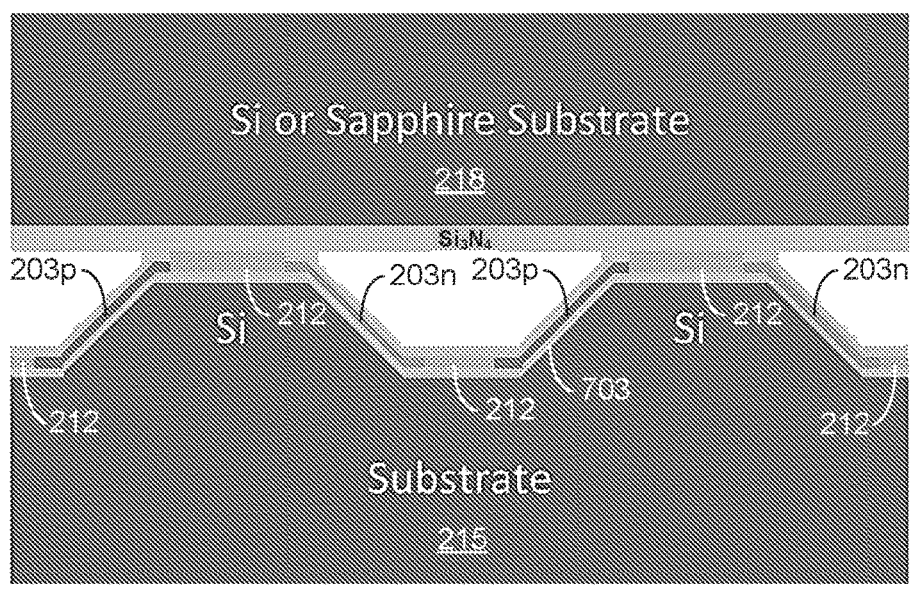
Figure 7H:
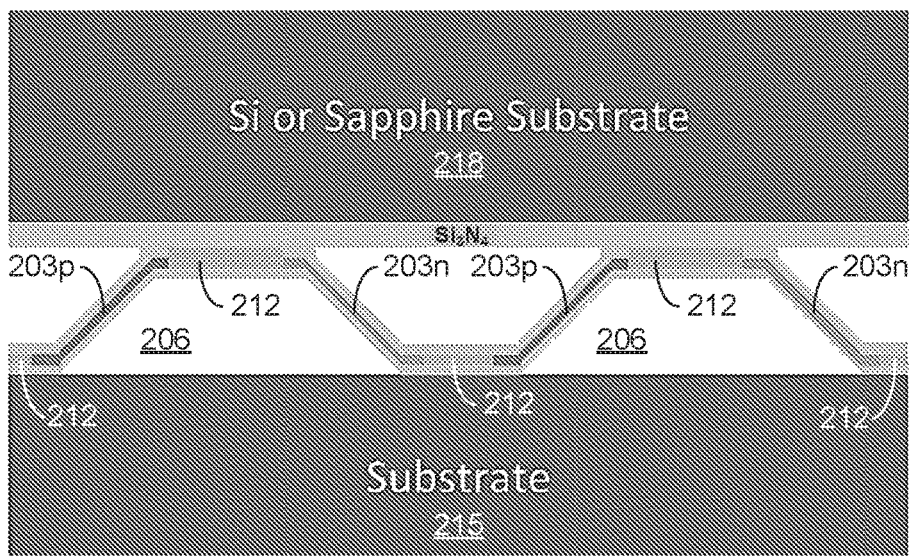
Figure 7I:
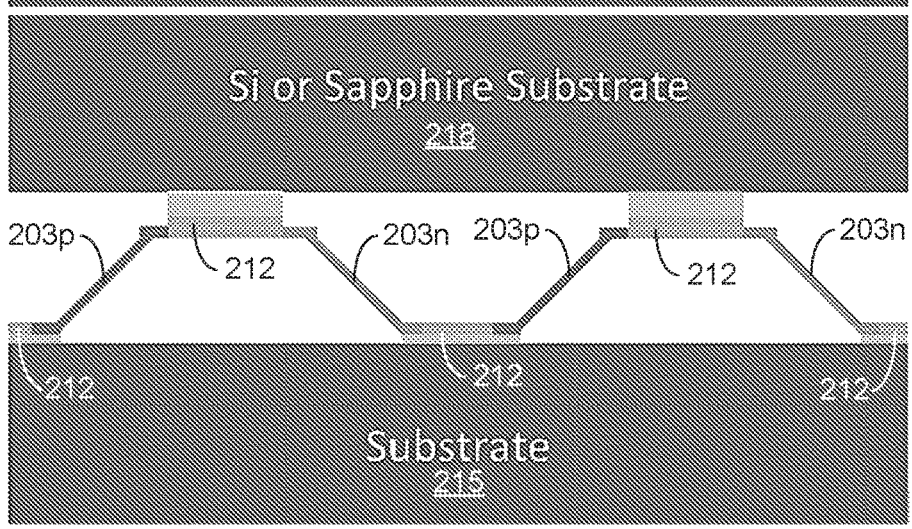
Figure 7J:
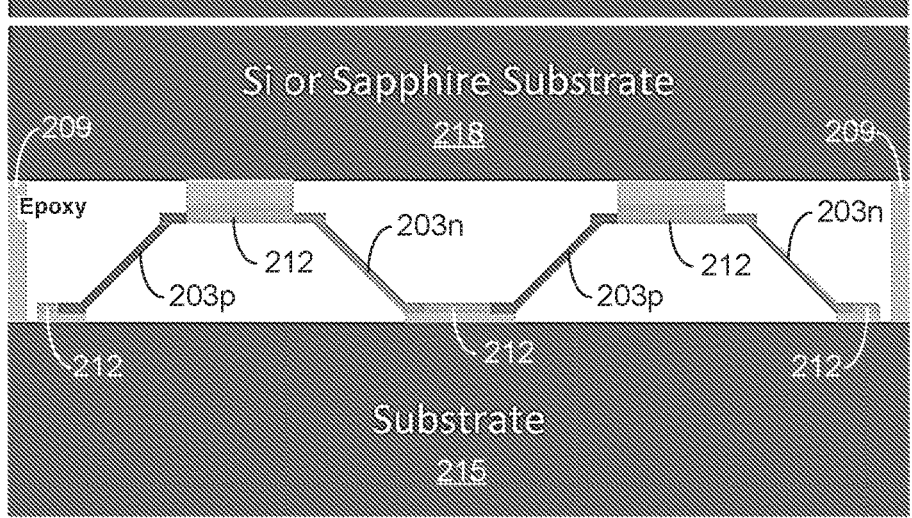

A layer 715 of $Si_3N_4$ can be deposited for device protection at 621 of FIG. 6. As shown in FIG. 7F, the layer 715 of $Si_3N_4$ can be formed and then the $Si_3N_4$ layer 715 can then be patterned with, e.g., a fluorine-based plasma dry etch to expose the interconnection metal 212 and the gap between the SiGe TE elements 203. Next at 624, the second wafer (or substrate) 218 can bond over the TE elements 203 as shown in FIG. 7G. The bonding substrate can be, e.g., a $Si/Si_3N_4$ substrate. At 627, the air bridge structure shown in FIG. 7H can be obtained by wet etching the first wafer 215 to form voids 206 under the pairs of TE elements 203. The remaining $Si_3N_4$ can also be removed by wet etched. For example, wet etching the mesas of the first wafer 215 in hot KOH solution can remove the Si to form air bridge structure. The remaining $Si_3N_4$ layers 703/715 on top of and underneath the SiGe TE elements 203 can be removed with, e.g., hot phosphoric acid as illustrated in FIG. 7I. As shown in FIG. 7J, the edges of the TE device 200 can be sealed with epoxy 209 at 630 of FIG. 6.

Figure 8A:
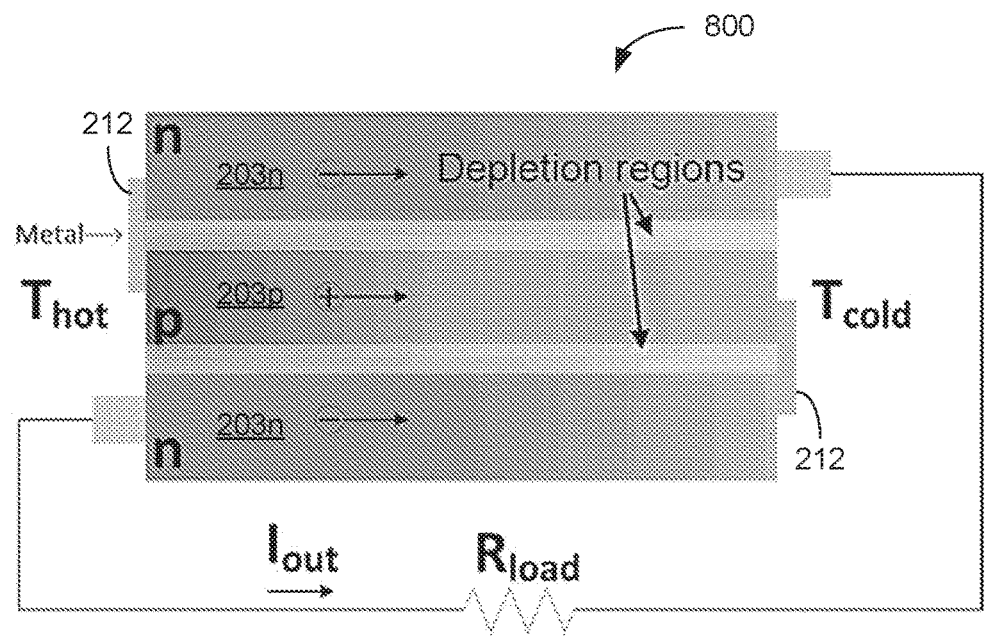
FIGS. 8A and 8B are graphical representations of an example of a three-dimensional (3D) TE device, in accordance with various embodiments of the present disclosure.
Figure 8B:
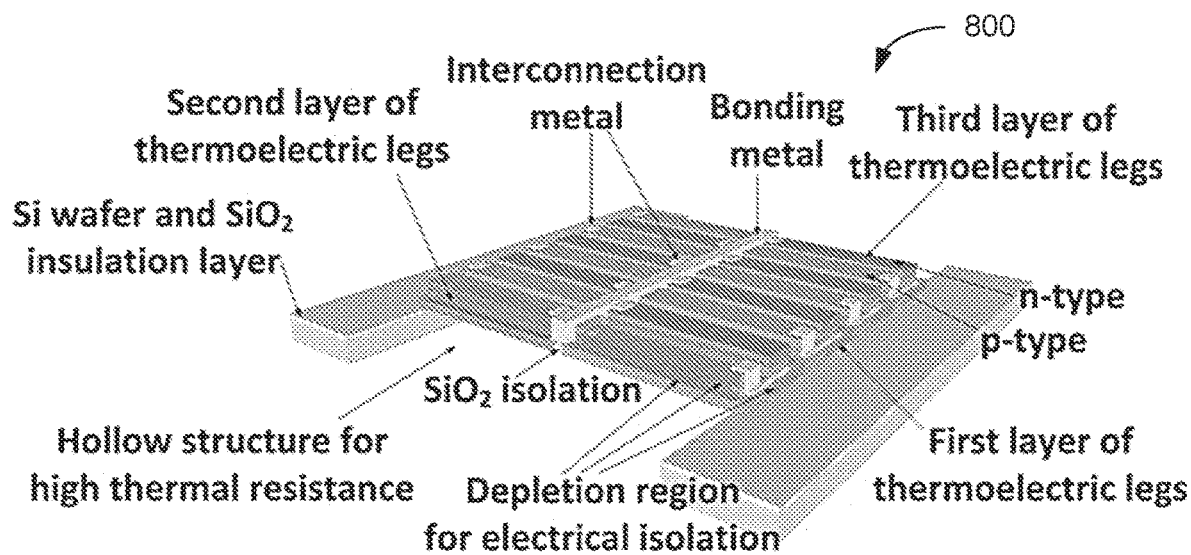

Another advantage of the thin film TEG design is the ability to make the TE device three dimensional where the p-type and n-type elements 203 can be stacked on top of each other in an alternating fashion to form a three-dimensional TEG (3D-TEG). FIGS. 8A and 8B illustrate an example of the simplified physical concept of a 3D-TEG 800. As shown in the example of FIG. 8A, the 3D-TE device 800 comprises stacked layers of alternating n-type and p-type TE elements 203. The individual TE elements 203n and 203p are separated by naturally forming depletion regions. For simplicity, the 3D-TE example in FIG. 8A has three stacked layers, but in principle, it can be any number of stacked layers. Therefore, in practice, depending on the size of the 3D-TE device 800 and the output voltage needed for the application, the number of stacked layers can be varied to achieve the desired result. The lateral temperature gradient drives the charge carriers from the hot side ($T_{hot}$) to the cold side ($T_{cold}$). With properly placed metal interconnections 212, the resulting Seebeck voltage in each layer moves the carriers in the desired direction such that the Seebeck voltages add up and increase the output voltage.

An example of the architecture is illustrated in the simplified drawing of a 3D-TE device (harvester) shown in FIG. 8B. The 3D-TE device 800 can be viewed as three stacked TE devices 200 isolated by vertical depletion regions that form between the individual p-type and n-type regions. The 3D-TE device 800 three layers of alternating p-type and n-type elements 203 (or regions) isolated by the vertical depletion regions. The three semiconductor layers form three independent TE generators while the lateral depletion regions between the elements provide the electrical separation. The first two TE elements are drawn transparently to show the interconnection metals 212. The p-type and n-type TE elements 203 are also separated by lateral depletion regions. The 3D-TE device 800 can significantly boost the performance over that of conventional TE modules.

a) In conventional TE modules, individual p-type and n-type elements 103 (FIGS. 1A and 1B) are bonded to a substrate and connected in series via metal interconnects.
In the 3D-TE design, the individual elements are separated by naturally forming depletion regions. The pn-junction isolation provides the following advantages:
The thin film 3D-TE design allows the number of TE elements 203 to be increased by orders of magnitude.
The thin film 3D-TE design enables the implementation of continuous concentric rings, which can be used to seal a TE device 200 or a 3D-TE device 800.
The thin film 3D-TE design reduces the parasitic electrical resistance of the metal interconnects 212 since the distance between adjacent TE elements 203 is almost zero.

b) The TE elements 203 can be sealed in vacuum eliminating the parasitic convective heat transfer through the air. This by itself can result in significant improvement in the performance of the 3D-TE design.

c) The concentric thermoelectric elements are self-sealing the vacuum; thereby, simplifying the packaging and reducing the parasitic heat losses through the sealants.

d) The 3D-TE device architecture utilizes micromachining techniques used in Si MEMS industry. The approach not only enables vacuum encapsulation, but it also allows making a thin-film device in which the TE length is independent of the thickness of the deposited film. This offers a significant improvement over conventional architectures because optimization of the electrical & thermal resistances of the elements can be achieved independent of the film thickness.

To understand the parameters affecting the functions of a wearable TEG and evaluate the power harvesting capability of a conventional TEG from body heat, a TEG on the skin was modeled and the power versus different parameters such as heatsink heat transfer coefficient, leg geometry, fill factor, etc. was calculated. FIG. 9A is a graphical representation illustrating the arrangement of the conventional TE device (TEG) 100 positioned between the skin 903 and a heatsink 906. The TEG parameters were 1 $cm^2$ area, 16 TE elements 203 each 0.6 mm×0.6 mm×1 mm (length×width×height), $\sigma_{av}$=1000 S/cm, $S_{av}$=200 V/K, $\kappa_{av}$=1.5 W/mK (i.e. zT=0.8), $T_a$=20° C., and $T_{core-body}$=37° C. The calculations were based on a three-dimensional finite element solution of the heat transfer equations in COMSOL including the thermal conduction, convection, and radiation from all surfaces. The effect of the skin roughness was further modeled to understand the skin and interface characteristics. An exaggerated view of the skin-TEG interface (including model parameters) is shown in FIG. 9B, where Y is the distance between mean lines of the two profiles in contact, $l_{ci}$'s are the lengths of the contact spots, and $y_i$'s are the vertical distances from the mean line.

The heat transfer model previously derived for a rough interface was followed and included it in the COMSOL calculations. Per this model, the relation between the heat transfer coefficient $h_c$ and the interface parameters can be written as $$h_c = 1.25 k_s \frac{\Delta a}{\sigma} \left(\frac{P}{H_c}\right)^{0.95}$$

in which $k_s$ is the harmonic mean thermal conductivity, $\Delta \alpha$ is the average surface asperity slope, $\sigma$ is the RMS surface roughness, P is the applied pressure and $H_c$ is the microhardness of the skin. The effects of the applied pressure, surface roughness and hardness of the skin on the output power of the TEG were investigated using this model. Interestingly, it was found that (a) the power does not have much dependence on the applied pressure over 5 kPa, (b) the power decreases with increasing skin roughness, both with and without heat sink as illustrated in FIG. 9C, and (c) the power remains almost constant with skin hardness without a heat sink, but has a somewhat decreasing trend with a heat sink. FIG. 9C is a plot illustrating the TEG power vs. skin roughness with and without a heat sink.

Figure 10A:
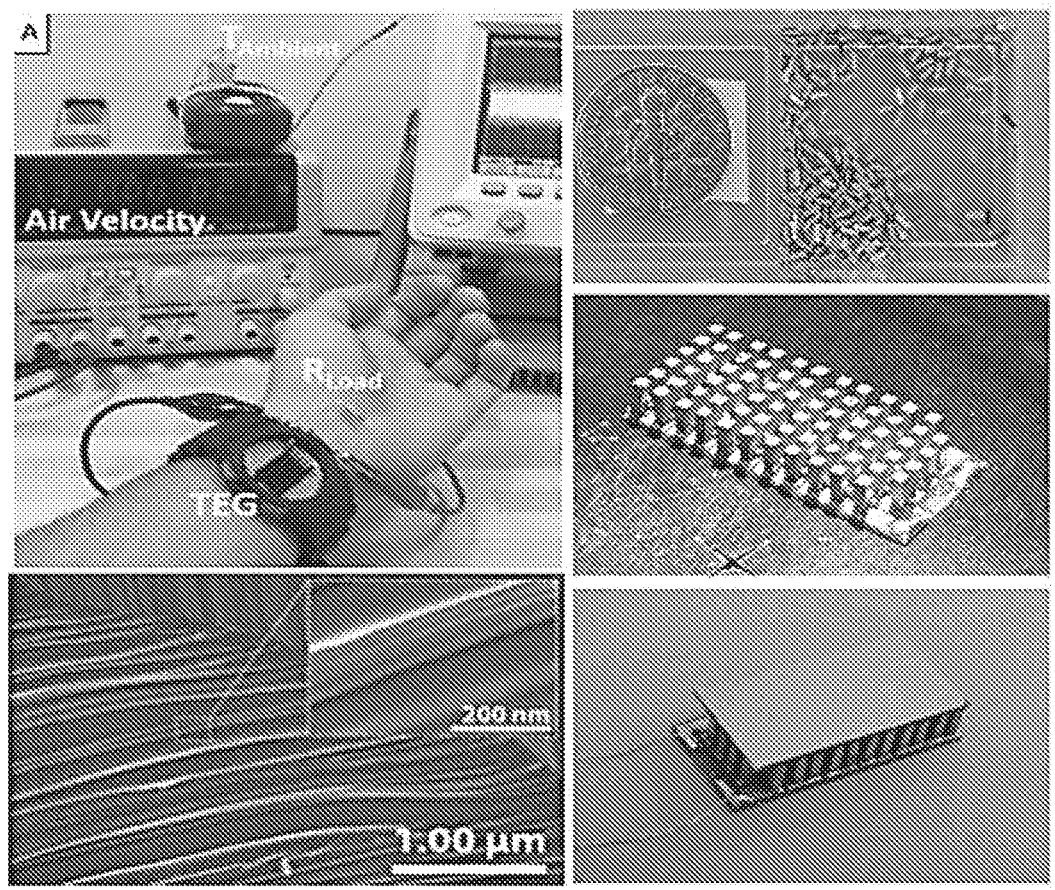
FIGS. 10A through 11C compare operation of thin film TE devices with conventional TE devices, in accordance with various embodiments of the present disclosure.
Figure 10B:
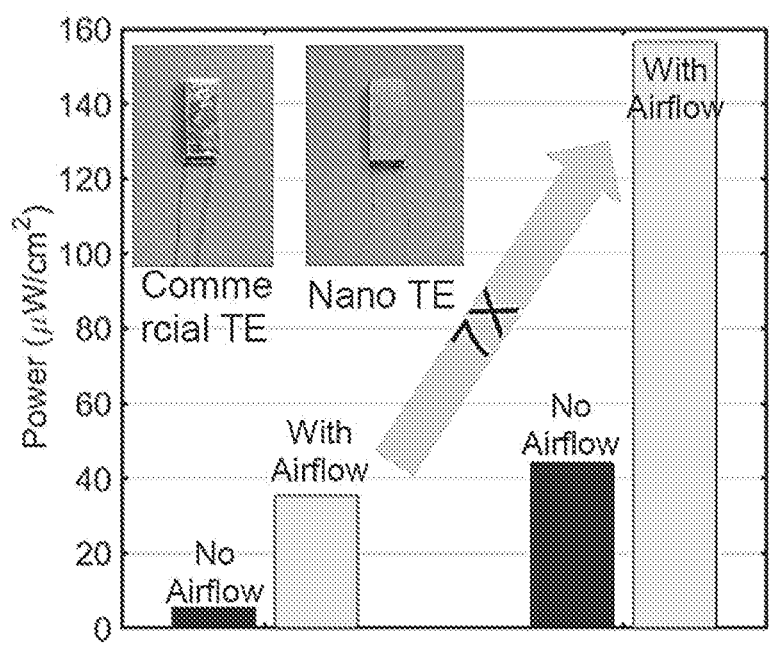
Figure 10C:
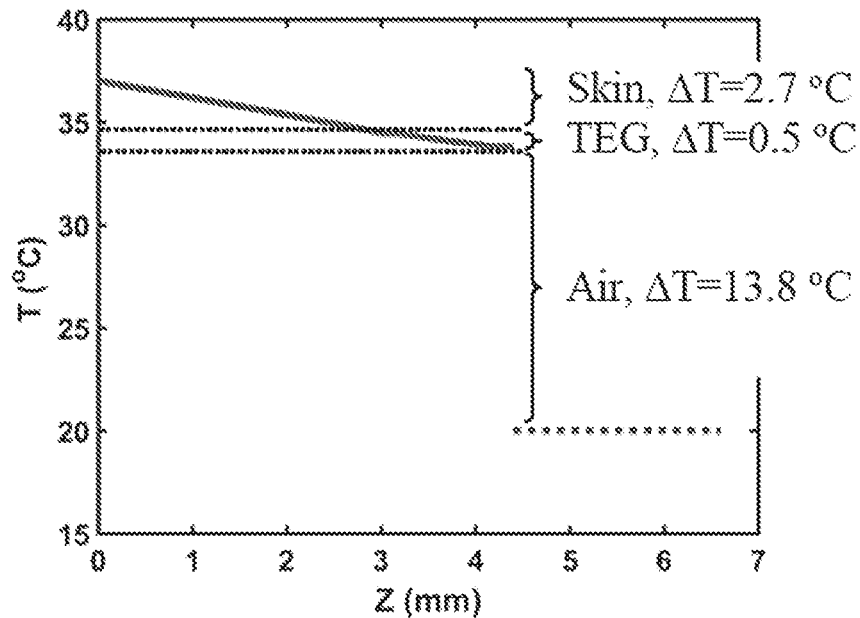

Research in TE materials and development of rigid and flexible TEGs has resulted in TEG technologies can increase the power generated from body heat by about two times compared to the previous state-of-the-art technologies and about four to seven times (44-156 μW/cm²) compared to the commercial TE devices illustrated in FIG. 10A FIG. 10B illustrates the increased power generation using heat spreaders of 14.3 cm². Per the model calculations, most of the temperature differential between the body core and the environment drops across the TEG-ambient interface and then across the skin. This is illustrated in FIG. 10C, where ΔT across the skin 903, TEG 100, and air(w/o heatsink). From a 17° C. temperature difference between the ambient and the core body temperature, only 0.5° C. drops across the TEG 100. Most of the temperature drops across the air-TEG interface. Having a good heat sink can significantly improve the output power, but a bulky heat sink is undesirable for body comfort.

Figure 11A:
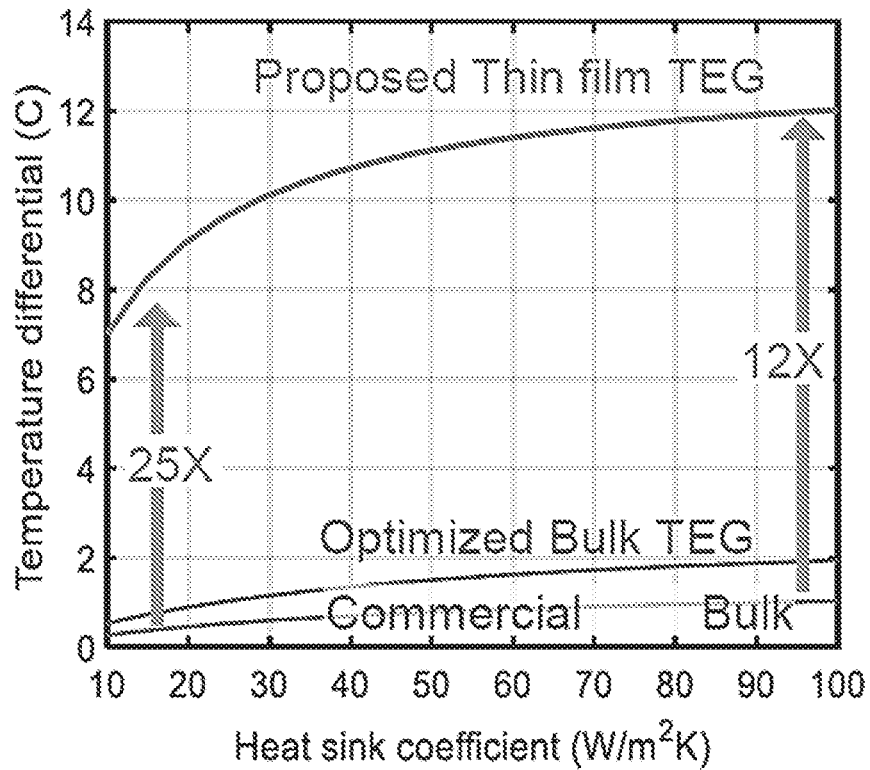

A solution for increasing the temperature drop across the TEG is to increase the device thermal resistance. To see a significant change, an increase in the thermal resistance by an order of magnitude may be needed. While optimization of bulk TEGs is possible by reducing the fill factor (FF) or increasing the l/A ratio, these parameters cannot be changed very much. For example, fill factors less than 25% make the TEG fragile, and it is difficult to cut several millimeters long TE elements with small cross sections (less than 0.5 mm×0.5 mm) due to the brittleness of $Bi_2Te_3$ compounds. To cut long and thin elements with state-of-the-art dicing and cutting tools, it has been found that an l/A of about 3 mm/(0.5 mm×0.5 mm) is almost the limit. The disclosed thin film TEG configurations, while having a very small form factor (about 1 mm including the headers), has nearly 3000 times higher thermal resistance when compared to a conventional device. This is mainly due to the large l/A ratio of the TE elements 203 in the planar geometry and the vacuum sealing of the TE devices. FIG. 11A compares the temperature drop across a commercial TEG, an optimized TEG (A=0.6 mm×0.6 mm, l=2 mm elements, FF=0.25), and the proposed thin-film TEG (A=1 μm×50 μm, l=400, FF=0.9). Similar material properties were assumed as before (zT=0.8). Interestingly, the ΔT for the thin-film TEG increases from about 0.5° C. to about 7° C., without any heat sink. A 12-25 times improvement in ΔT was predicted for the 3D-TE device 800. It is also seen that the TEG power is less sensitive to the heat sink. Larger ΔT results in larger Seebeck voltage and power.

Figure 11B:
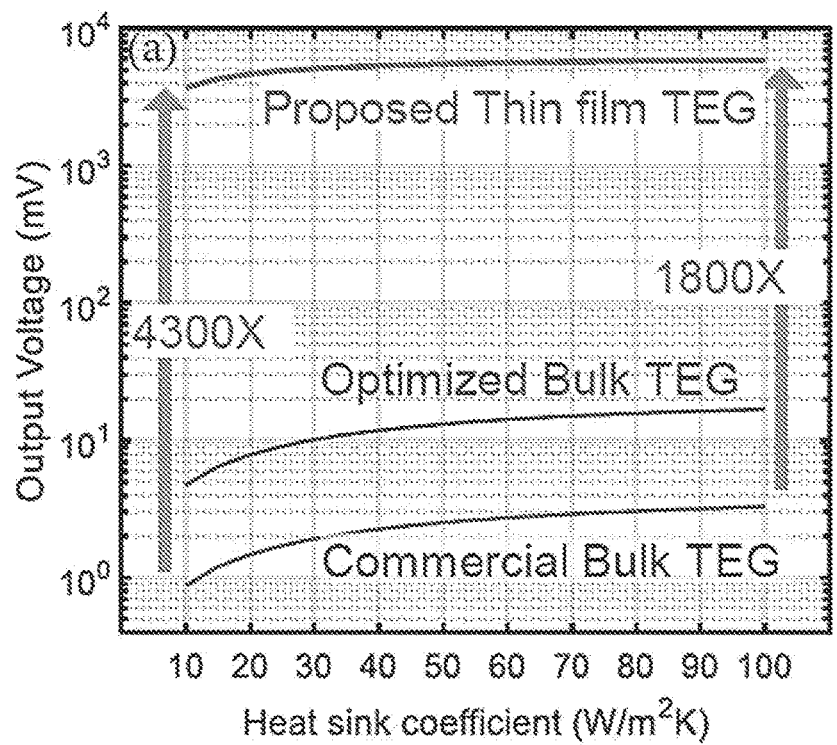

TE devices are generally considered low-voltage high-current generators. As discussed earlier, a wearable TEG produces too small of a voltage to efficiently run a power management unit (PMU) to power sensors or other wearable electronics. But the problem is that the current PMUs have very low efficiencies at low input voltages. The disclosed 3D-TEG, compared to conventional TEGs, has orders of magnitude larger number of TE elements per unit area (e.g., about 4500 elements per cm²), which will result in a much higher voltage. FIG. 11B compares the voltage generated from different TEGs under similar conditions. The voltage from both the commercial and the optimized bulk TEG remains under 20 mV for the whole range of the heat sink heat transfer coefficients. The DC/DC boost converter of the current PMUs do not even start at such a low voltage, or they would have a very poor efficiency (less than 10%). The disclosed 3D-TE device 800 generates a voltage of greater than 4V under similar conditions (1800-4300 times enhancement in predicted voltage). This voltage is large enough to charge a supercapacitor or a rechargeable battery. Therefore, a booster is not needed in the PMU. This will drastically enhance the system efficiency.

Figure 11C:
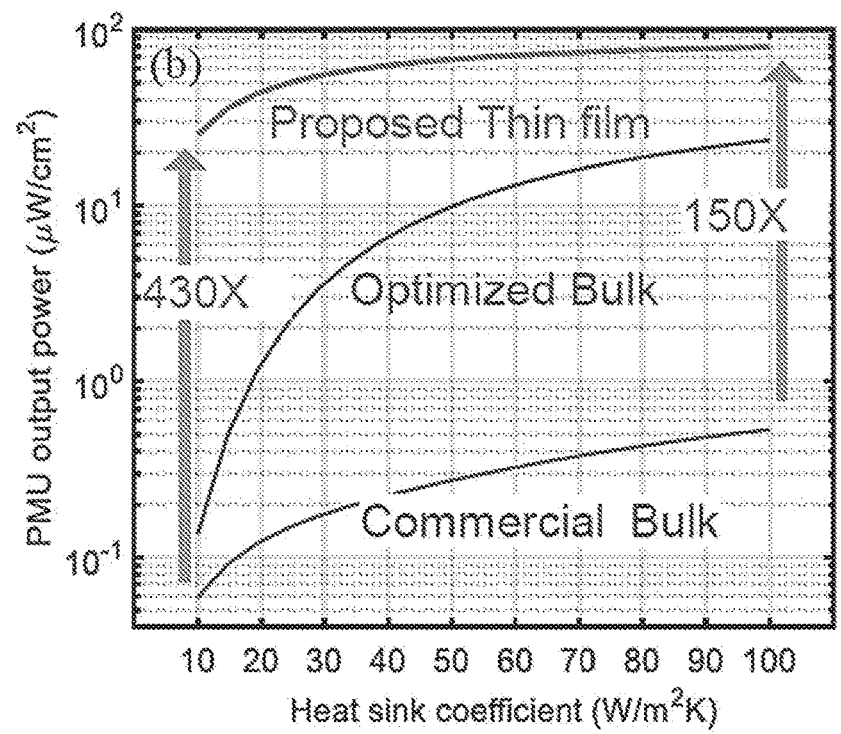

FIG. 11C shows the comparison of the system power levels when these TEGs are connected to a state-of-the-art PMU. The characteristics of the PMU were assumed to have an efficiency of 21% and 79% at input voltages of 20 mV and 50 mV, respectively. A significant enhancement in the system power (150-430 times) was predicted for the 3D-TEG 800. The plots were normalized per cm². Depending on the need and application, the TEG size can be scaled. In practice, a thermal spreader can also be used under the TEG that would collect more heat from the skin, which would result in higher power. A thermal spreader was not included in these calculations.

Figure 12:
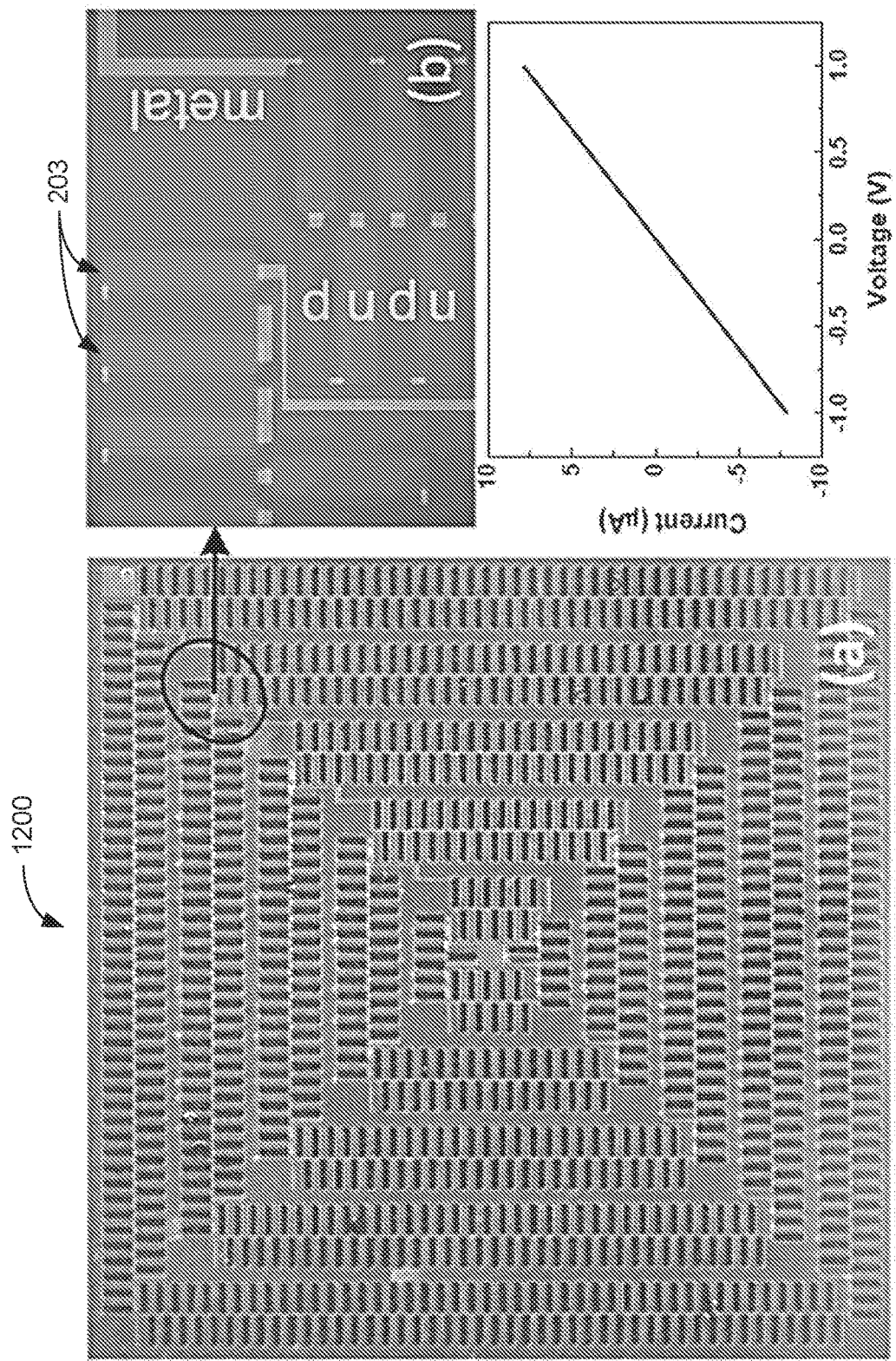
FIG. 12 illustrates an example of a prototype thin film device, in accordance with various embodiments of the present disclosure.

To illustrate the feasibility of the disclosed TE devices 200 and 800, a prototype device 1200 composed of a single layer of p-type and n-type elements 203 was fabricated as shown in FIG. 12. The architecture of the prototype device 1200 is similar to the TE device 200d shown in FIG. 3D; however it includes five concentric rings of TE elements 203 to obtain a higher voltage output. Thousands of p-and n-type TE elements 203 were electrically separated by lateral depletion regions, and connected in series by interconnection metal 212. The TE material employed in this prototype device was polycrystalline silicon (poly-Si) film due to its ease of fabrication. The poly-Si film was selectively doped with boron and phosphor with spin-on dopants to obtain p-type and n-type poly-Si, respectively. For the case of $(Bi,Sb)_2Te_3$ and $Bi_2(Se,Te)_3$, low temperature PLD deposition, a lift-off process, and post-patterning annealing can be used.

After doping, the sheet resistance of the p-type and n-type poly-Si was measured to be 15.6 Ω/□ and 12 Ω/□, respectively. The dimension of the prototype device 1200 was 1 cm×cm, and the dimensions of the individual TE elements 203 were 1 μm(W)×100 μm (L)×400 μm(H). Per the measured sheet resistance and TE leg dimensions, each n-type and p-type element 203 has a resistance of 48Ω and 62.4Ω, respectively. Consequently, if the TE elements 203 are successfully separated by the lateral p-n junction and all connected in series, the resistance of the device should be about 1000×(62.4+48)=110.4 kΩ. To verify this, the current-voltage of the prototype device 1200 was measured and plotted as shown in FIG. 12. The resistance was measured to be 127 kΩ, which is close to the estimated value and confirms the continuity of the device. With this device structure, if each TE element generates 200 uV/K, the output voltage can reach as high as 0.4 V/K. This is for single layer device. With the 3D architecture, the output voltage can exceed 1 V/K.

Figure 13:
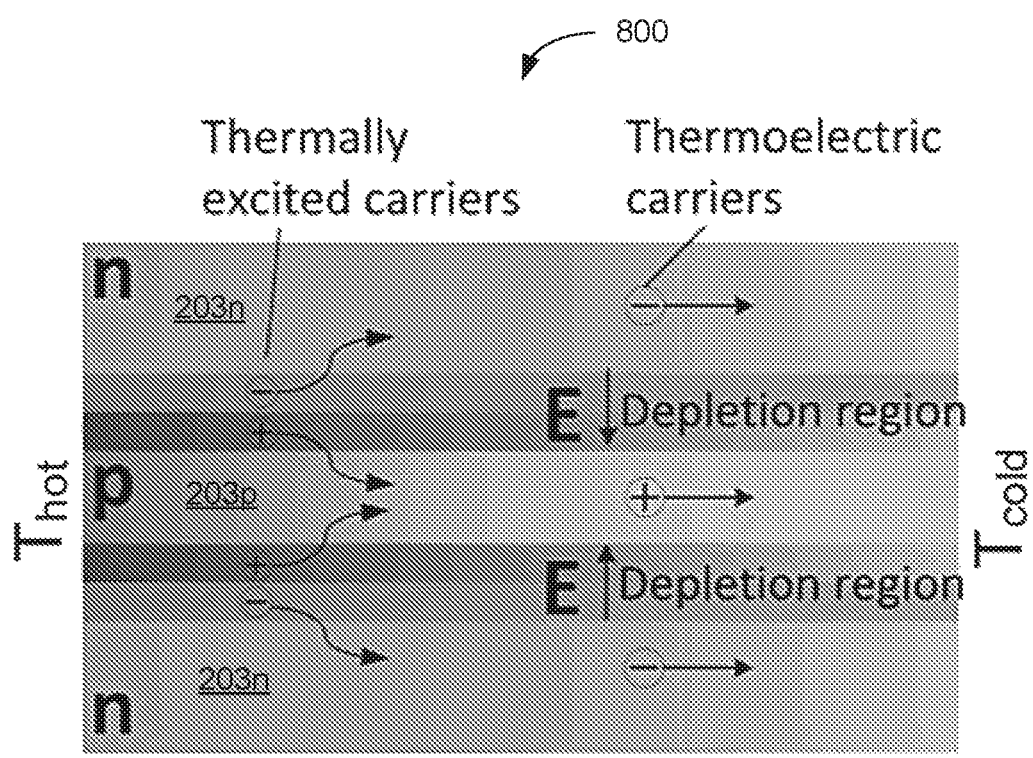
FIG. 13 is a graphical representation illustrating depletion region effects present in a 3D-TE device, in accordance with various embodiments of the present disclosure.

It is important to note that the thin film TE devices 200 and 800 are not limited to wearable applications. In fact, the structural improvements can be extended to high-temperature applications as well. A closer look at, e.g., the proposed 3D-TEG 800 reveals that in this structure, there is another favorable effect in play, which is related to the bipolar effect due to the thermal excitations. This is illustrated in FIG. 13. At high enough temperature, minority carriers are excited, and the current will be bipolar comprising both minority and majority carriers. Therefore, a diffusion current is generated from the hot side to the cold side due to the larger population of the thermally excited electron-holes pairs on the hot side of the 3D-TE device 800. This also applies to 2D-TE devices 200 such as in FIGS. 3C and 3D. In conventional TE devices, the electron-hole pairs diffuse from the hot side to the cold side, recombine in the cold side, and release their energy as heat. Therefore, they add to the thermal conduction. Moreover, since the Seebeck coefficients for electrons and holes have opposite signs, the total Seebeck coefficient is reduced upon thermal excitations.

In the 3D-TE device 800, the excess electron-hole pairs on the hot side of the depletion region are swept away by the strong electric field in the depletion regions into the neutral regions and add to the thermoelectric current as shown in FIG. 13. Thermally excited (minority) carriers contribute positively by joining the majority carriers separated by the built-in potential at the p-n junction. Therefore, in contrast to the conventional devices, the electron and holes will not contribute counteractively in Seebeck coefficient. Also, the built-in potential prevents the recombination of these electrons and holes; hence, they will not add to the thermal conduction. While the electron-hole diffusion acts negatively in conventional thermoelectric devices, it has been turned into a positive effect here. It is expected that due to this change, the falling slope of zT, which is often observed at high temperature, should be delayed to higher temperatures resulting in further zT improvement.

Figure 14:
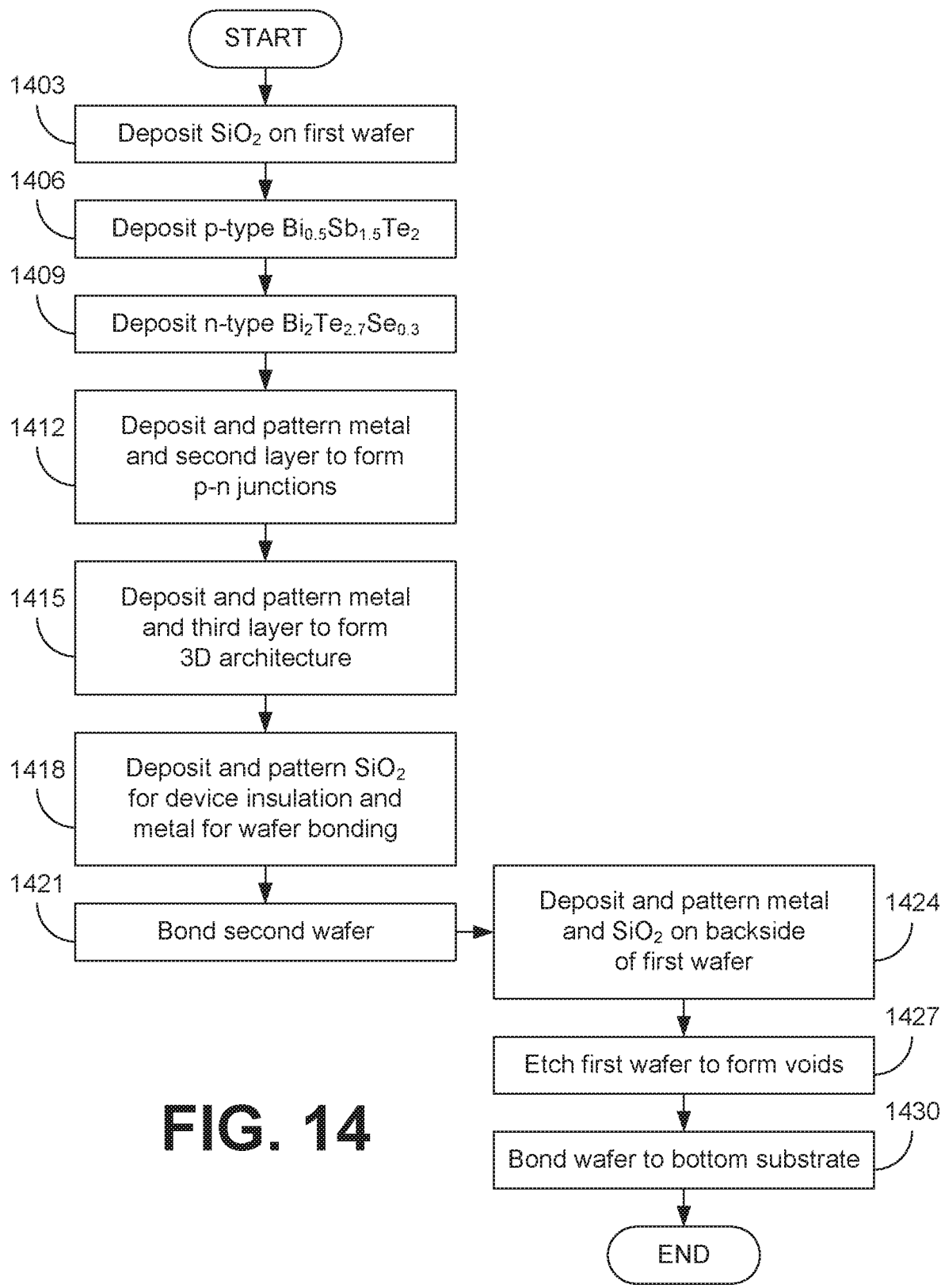
FIGS. 14 through 15J illustrate an example of a fabrication process for 3D-TE devices, in accordance with various embodiments of the present disclosure.
Figure 15A:
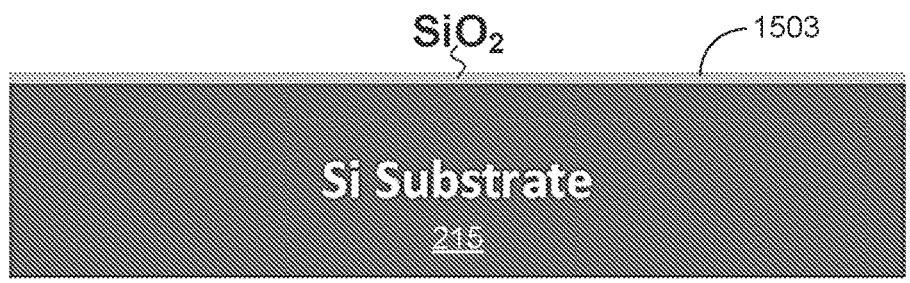
Figure 15B:
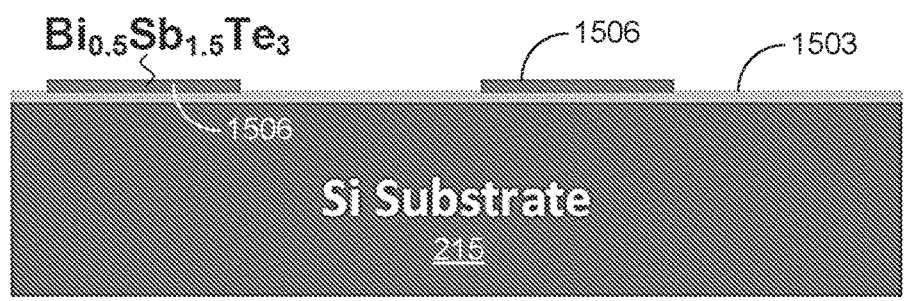

Referring next to FIG. 14, shown is a flowchart illustrating an example of a process flow for fabricating a 3D-TEG 800. The fabrication process is shown for $(Bi,Sb)_2(Se,Te)_3$ alloy based thermoelectric devices, but it can be adapted for the use of other thin film TE materials such as, e.g., Si and SiGe. Beginning at 1403, a layer 1503 of $SiO_2$ (e.g., 100 nm thick) can be deposited on the first wafer (e.g., Si) using, e.g., a low-pressure chemical vapor deposition (LPCVD) method, as shown in FIG. 15A. Dual layers of photoresist (specific for lift-off purposes) can be spin coated and patterned on the $SiO_2$ layer 1503. For example, LOR resist from MicroChem Corp. can be employed because it can create a controllable undercut for lift-off purposes and also has high thermal stability (up to 190° C.), which allows it to survive during the following material deposition process. At 1406, a layer 1506 of $B_{0.5}Sb_{1.5}Te_3$ p-type material (e.g., 2 μm thick) can be deposited by, e.g., PLD at about 150° C. and then patterned by lift-off in photoresist remover, as illustrated in FIG. 15B. The Dual layers of photoresist (specific for lift-off purpose) can then be spin coated and patterned on the $Bi_{0.5}Sb_{1.5}Te_3$ layer 1506.

Figure 15C:
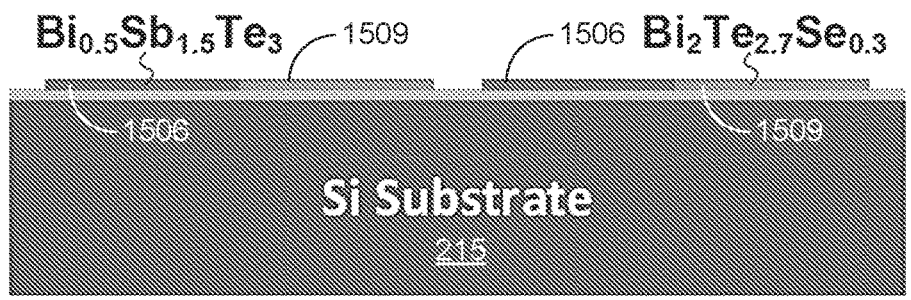
Figure 15D:
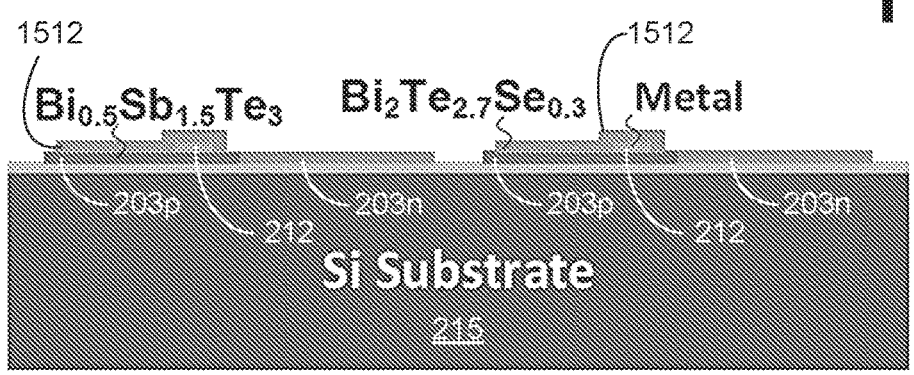
Figure 15E:
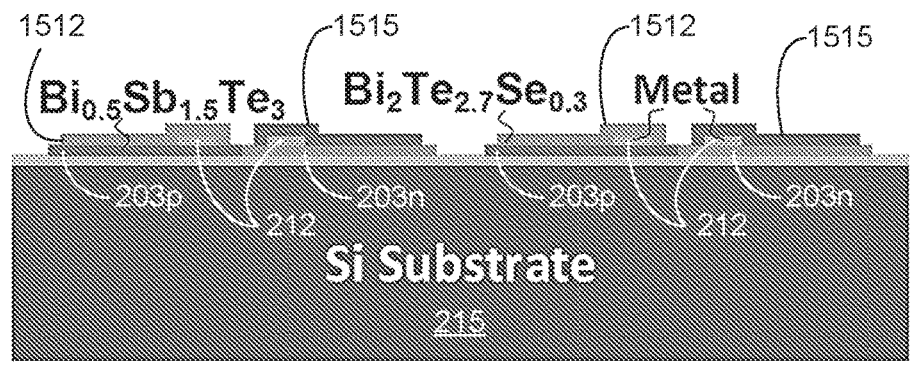

Next at 1409 of FIG. 14, a layer 1509 of $Bi_2Te_{2.7}Se_{0.3}$ n-type material (e.g., 2 μm thick) can be deposited by, e.g., a PLD technique at about 150° C. and then patterned by lift-off in photoresist remover, as shown in FIG. 15C. The patterned layers 1506 and 1509 form a first layer of p-type and n-type TE elements 203p and 203n. Metal 212 can be deposited and patterned at 1412. Evaporation and lift-off can be used to form interconnects (e.g., 200 nm thick Ti) between adjacent p-type and n-type TE regions 203. This can be followed by deposition and patterning of a second layer comprising $Bi_2Te_{2.7}Se_{0.3}$ regions 1512 and $Bi_{0.5}Sb_{1.5}Te_3$ regions 1515 (e.g., 2 μm thick) on the underlying p- and n-type TE elements 203 of the first layer, thereby forming vertical p-n junctions (or isolations), as illustrated in FIGS. 15D and 15E. The patterned layers 1512 and 1515 form the second layer of n-type and p-type TE elements 203. At 1415, evaporation and lift-off can be used to form interconnects (e.g., 200 nm thick Ti) between adjacent p-type and n-type TE regions 203. This can be followed by deposition and patterning of a third layer comprising $Bi_2Te_{2.7}Se_{0.3}$ regions and $Bi_{0.5}Sb_{1.5}Te_3$ regions (e.g., 2 μm thick) on the underlying n- and p-type regions 203 forming the vertical p-n junctions for electrical isolation. The metal 212 can form interconnects between lateral adjacent p-type and n-type elements 203 and completes the device interconnection. This metal connection is not shown in the figure for simplicity. This combination can be repeated to achieve the desired number of layers for the 3D-TE device 800. The films can then be annealed in argon to improve their electrical properties. Annealing temperature can be optimized through TE characterizations of several control samples (e.g., between 250° C. to 350° C.).

Figure 15F:
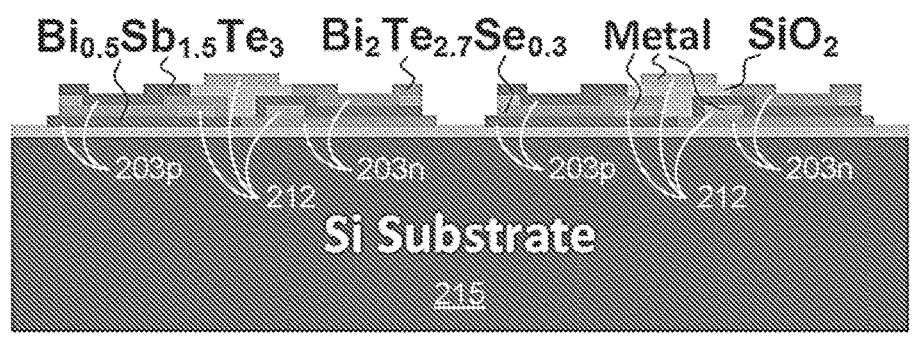
Figure 15G:
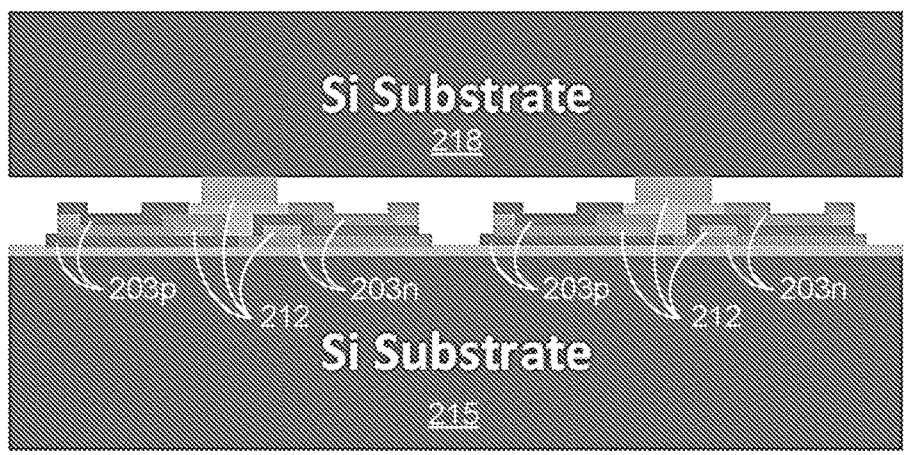

At 1418, $SiO_2$ can be deposited and patterned for device isolation and metal 212 disposed for wafer bonding, as shown in FIG. 15F. A $SiO_2$ layer can be deposited by, e.g., plasma enhanced chemical vapor deposition (PECVD), and patterned using, e.g., photolithography and wet etching in buffered oxide etchant (BOE). This can then be followed by formation of metal contacts (e.g., 2 μm thick Ni/Sn) by evaporation and lift-off. A second wafer (or substrate) 218 can be bonded over the TE elements 203 at 1421. First, a metal alloy (e.g., 2 μm Ni/Sn) can be deposited and patterned on the second substrate 218 by, e.g., electroplating or e-beam evaporation and lift-off. The second substrate 218 can then be bonded to the device using thermocompression in a vacuum, thereby sealing a vacuum between the concentric rings of TE elements 203.

Figure 15H:
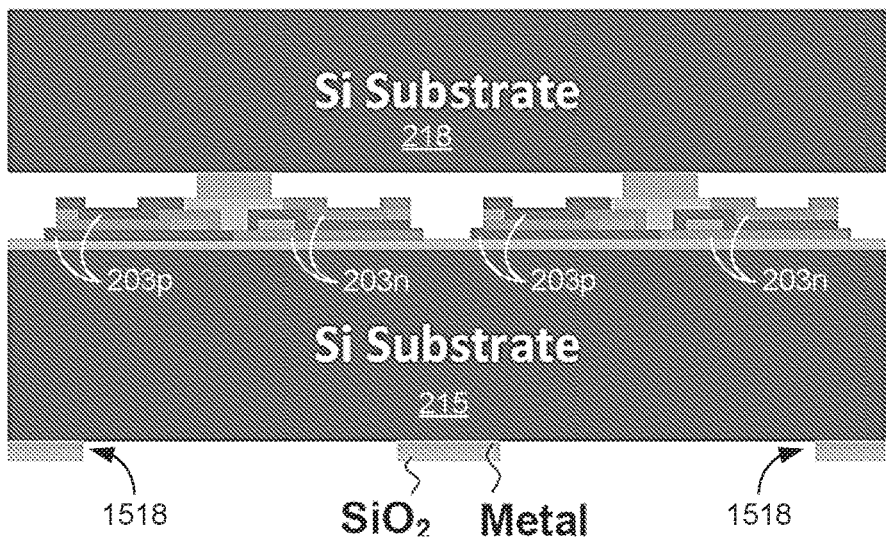
Figure 15I:
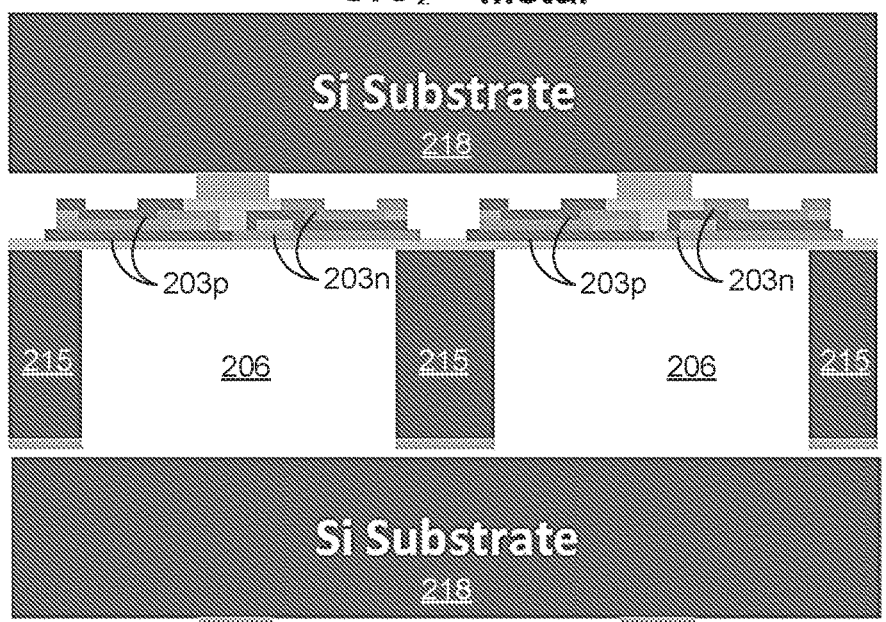
Figure 15J:
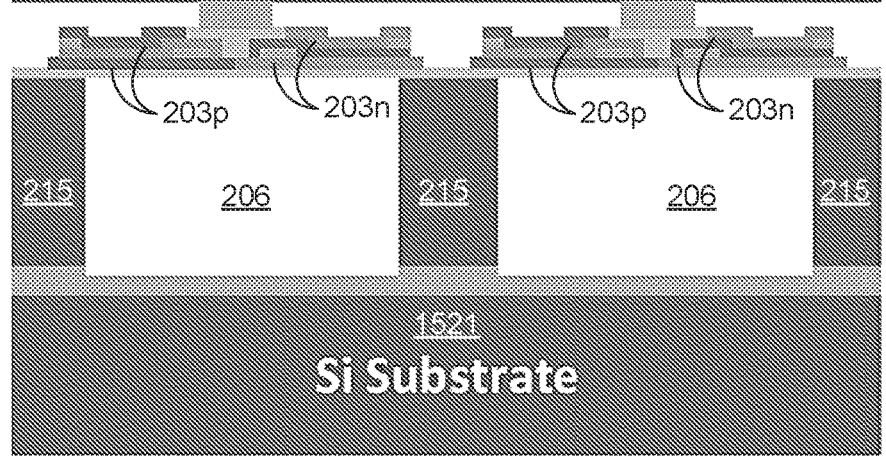

Next at 1424 of FIG. 14, metal and $SiO_2$ 1518 can be deposited and patterned on the backside of the first wafer 215, as illustrated in FIG. 15H. For example, Ni/Sn metal can be formed by electroplating or e-beam evaporation and lift-off on the bottom of the first substrate 215. This can be followed by PECVD of a $SiO_2$ layer (e.g., 2 μm thick), and patterned by photolithography and reactive ion etching (RIE). At 1427, the first substrate can be etched to form voids 206 under the stacked TE elements 203, as shown in FIG. 15I. The first substrate (e.g., Si) can be etched via deep reactive ion etching (DRIE) to obtain the voids 206 under the TE elements 203. The remaining $SiO_2$ layer can be removed by wet etching in BOE. A new substrate 1521 can be bonded to the bottom of the first wafer 215 at 1430, as shown in FIG. 15J. For example, Ni/Sn metal alloy (e.g., 2 μm thick) can be deposited on the new substrate 1521 by electroplating or e-beam evaporation. The new substrate 1521 can then be bonded to the bottom of the device 800 by, e.g., thermocompression in a vacuum.

Current thermoelectric and photovoltaic generators rely on a single energy conversion mechanism. It may be possible to significantly increase the conversion efficiency of these devices if they can integrate multiple mechanisms to generate and collect carriers. The disclosed thin film TE devices 200 and 800 can provide such an improvement. A new class of energy harvesting devices (PTEGs) that combine multiple energy carriers, namely, electrons, holes, excitons, phonons, and photons are now presented. These devices can stimulate a paradigm shift in modern energy harvesters that can significantly surpass the efficiency limits of existing technologies.

The presented thin-film thermoelectric device that can provide a 100 times improvement in the generated output voltage compared to conventional TE devices. The device can harvest both photoexcited (light) and thermoelectric (heat) carriers to further increase the output power. This hybrid device can be referred to as "photo enhanced thermoelectric generator" (PTEG) because it is a thermoelectric module delivering the highest possible output voltage and using available light to boost its performance further. In reality, this is a hybrid device that utilizes the semiconductor legs to serve double duty and simultaneously harvest both heat and light energy. The PTEG device can comprise several thousands of TE legs (or elements) 203 per $cm^2$ where each pair of TE elements 203 combines photoexcited and thermoelectric carriers that flow in the same direction to produce a larger output current.

Figure 16:
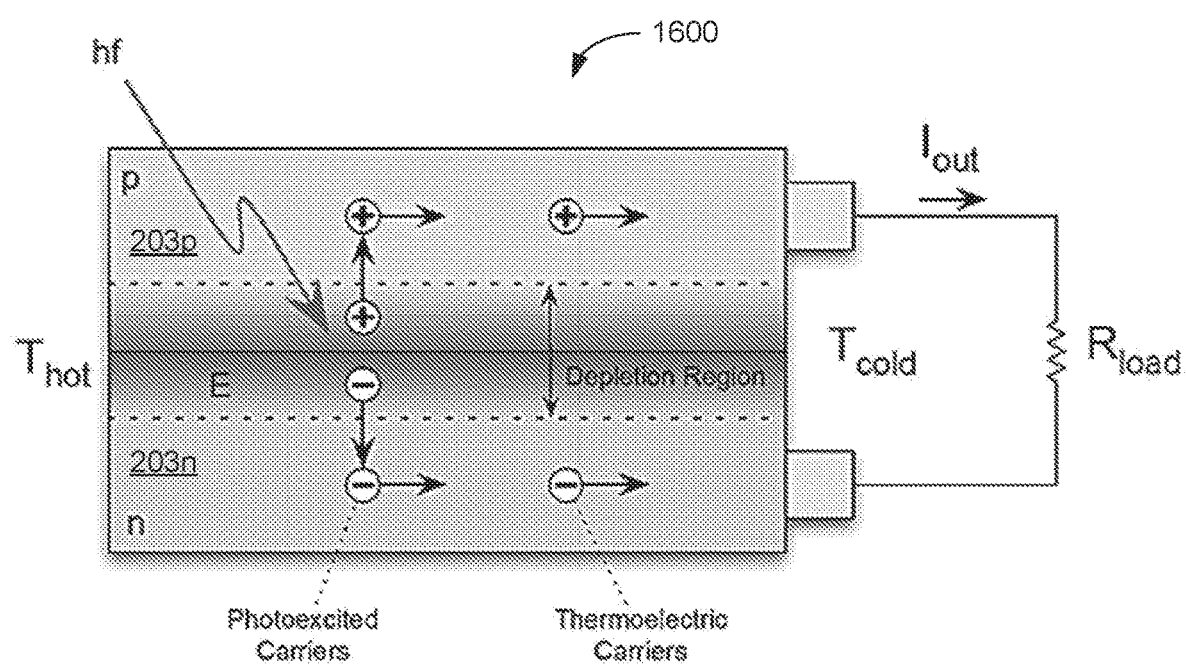
FIG. 16 is a graphical representation illustrating electron-hole contributions in a photo enhanced thermoelectric generator (PTEG), in accordance with various embodiments of the present disclosure.

FIG. 16 illustrates the simplified physical concept of the PTEG 1600. A single p-n junction formed from stacked p-type and an n-type TE elements 203$p$ and 203$n$ is shown with light (hf) entering the device from the p-type side. Additionally, there exists a lateral temperature gradient, which drives the charge carriers from the hot side ($T_{hot}$) to the cold side ($T_{cold}$) along the temperature gradient. The electron-hole pairs generated in the depletion region are swept by the built-in electric field to the neutral regions, where they join the thermoelectric carriers. It is important to note that the resulting Seebeck voltage in each layer moves the photoexcited carriers in the desired direction such that the two currents add and increase the output current flowing through the external load.

In the structure of FIG. 16, while smaller than the solar contribution, there is another favorable effect in play. In the depletion region on the hot-side of the PTEG device 1600, there exists a larger population of excitons and thermally excited electron-hole pairs compared to the cold side. Therefore, there will be an additional diffusion current from the hot side to the cold side of the PTEG device 1600. These carriers are also swept away by the strong electric field in the depletion region into the neutral regions and add to the photovoltaic and thermoelectric currents. While the electron-hole diffusion acts negatively in conventional thermoelectric devices, it has a positive effect here in the PTEG device 1600.

Figure 17A:
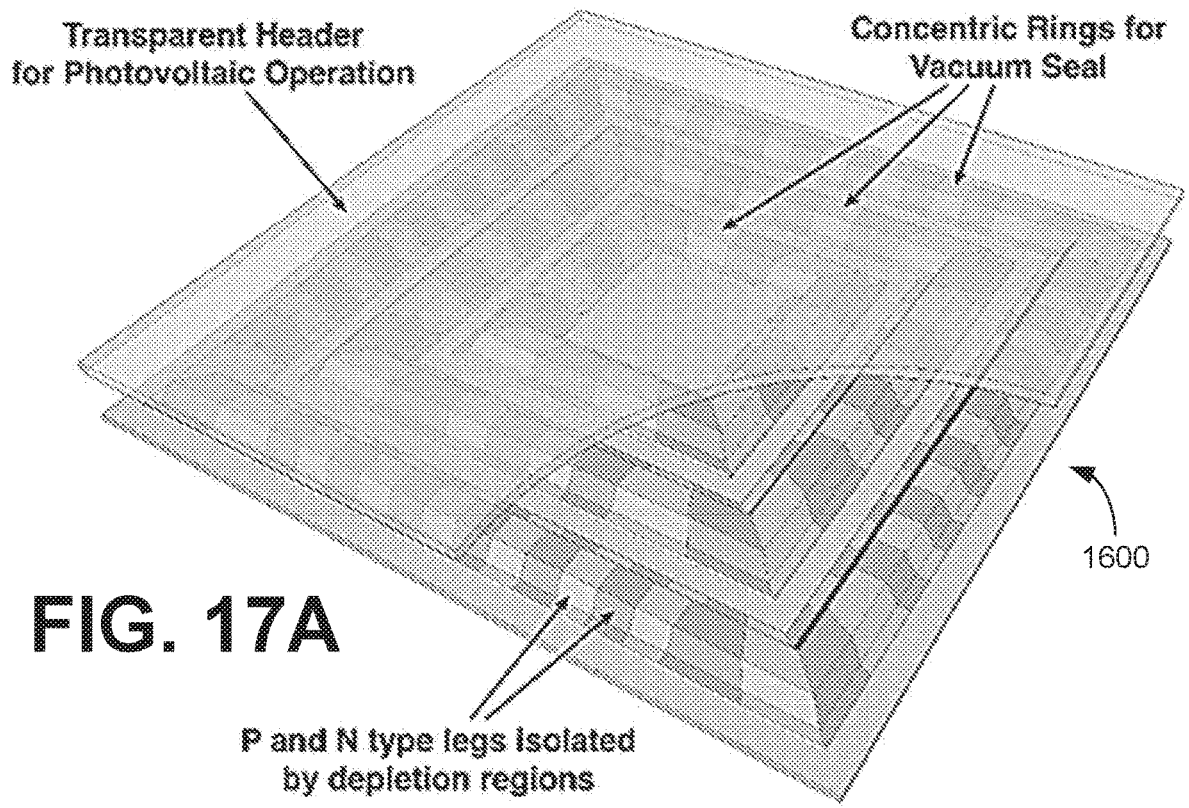
FIGS. 17A and 17B are graphical representations illustrating an example of a PTEG device, in accordance with various embodiments of the present disclosure.

FIG. 17A shows the simplified schematic of the overall structure of the PTEG device 1600. For clarity, the second TE layer, as well as the contacts, are not shown. The PTEG device 1600 comprises numerous concentric rings made of alternating p-type and n-type elements 203 that serve as the thermoelectric legs. For simplicity, the PTEG device 1600 shown in FIG. 17A includes only three rings of TE elements 203. In practice, depending on the device size, two or more rings can be utilized. A transparent header is included to allow for photonic excitation of the TE elements 203. The device incorporates several innovations that can significantly boost the performance of the PTEG device 1600 such that even without incident light, the PTEG device 1600 can perform far better than conventional TE modules. For instance, advantages of the PTEG device 1600 are similar to those of the 3D-TE device 800:

a) In the PTEG design, the individual elements are separated by naturally forming depletion regions. The p-n junction isolation provides the following advantages:

It reduces the parasitic electrical resistance of the metal interconnects, but it also maximizes the number of legs that can be incorporated in a given area.

It enables continuous concentric rings enabling vacuum encapsulation. Conventional TEG modules do not employ vacuum.

The depletion regions separating the p- and n-type legs of the thermoelectric module provide the volume for generating the photoexcited electron-hole pairs.

b) The TE legs (or elements) 203 can be encapsulated in vacuum eliminating the parasitic heat conduction through the air surrounding the legs in conventional devices. This can result in nearly ten times improvement in the performance of the PTEG device 1600.

c) The concentric circles of TE elements 203 offer a self-sealing vacuum design;

thereby simplifying the packaging and reducing the parasitic heat losses through the sealants.

d) The incident light is oblique to the temperature gradient. The oblique semiconductor legs 203 are exposed to incident photons for photovoltaic operation.

e) The PTEG device architecture relies on micromachining techniques used in Si MEMS industry. This approach not only enables vacuum encapsulation, but it also allows for the creation of a thin-film device in which the TE leg length is independent of the thickness of the deposited semiconductor layers. This is an improvement over conventional architectures because optimization of the electrical & thermal resistances of the legs can be achieved independent of the film thickness.

Figure 17B:
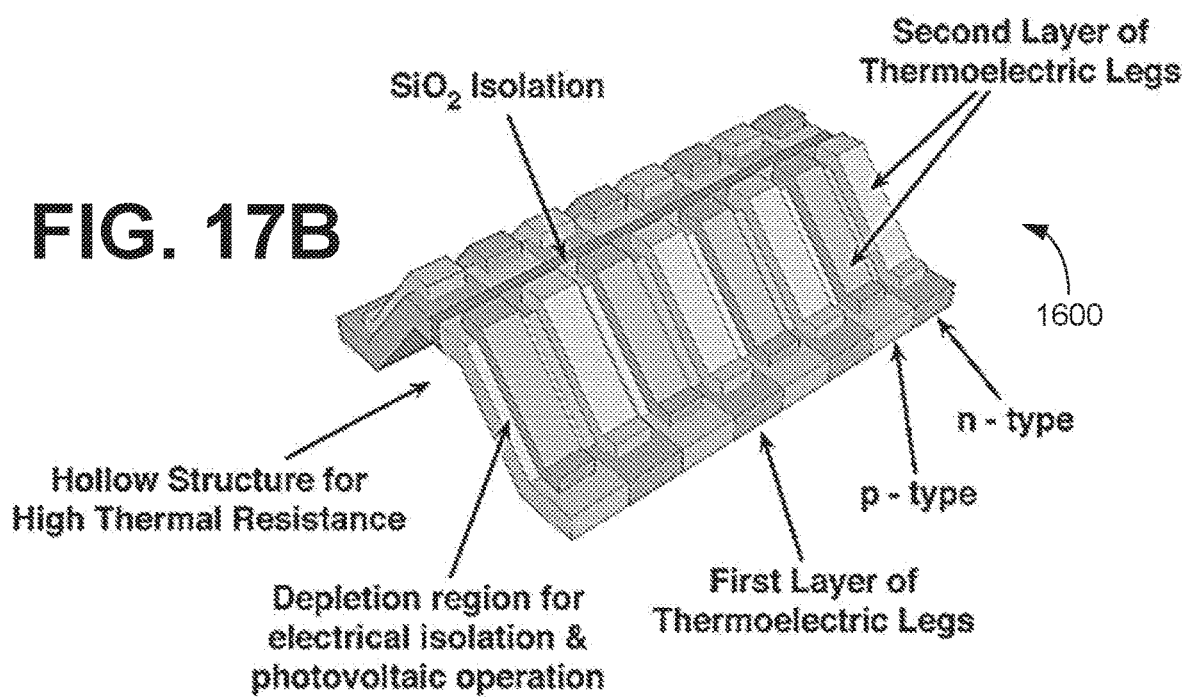

FIG. 17B is a graphical representation illustrating the improved version of the architecture in a section of the PTEG device 1600. The PTEG device 1600 can comprise two stacked layers of alternating p-type and n-type TE elements 203 isolated by vertical depletion regions that form between the individual p-type and n-type regions 203. The depletion regions provide the volume for the active region of the photovoltaic effect. The p-type and n-type elements 203 are also separated by lateral depletion regions, which further contribute to the photovoltaic current. The two semiconductor layers form two independent thermoelectric generators while the depletion regions between them provide the active region for photon absorption and the electric field for collecting the photoexcited charge carriers.

Figure 18:
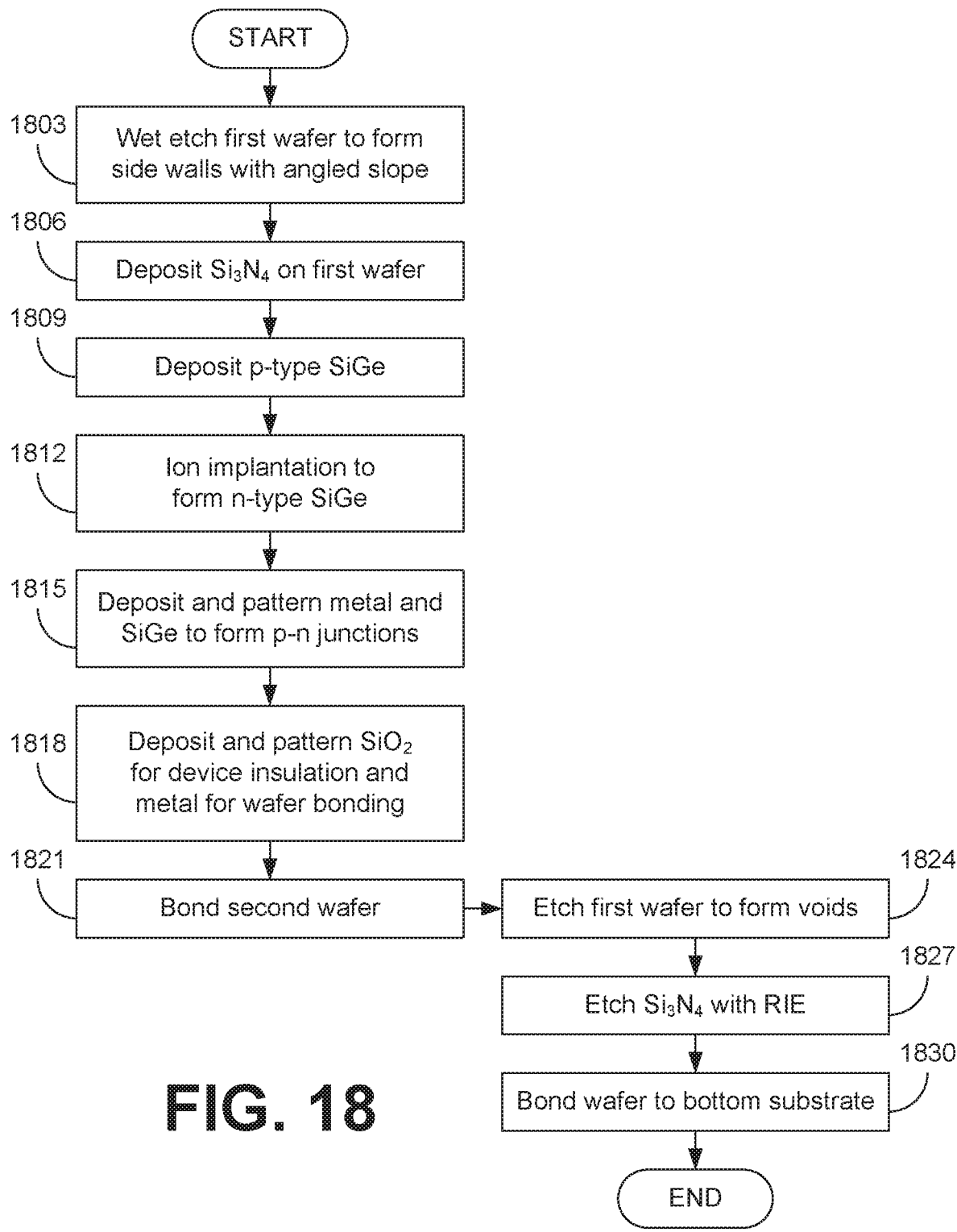
FIGS. 18 through 19J illustrate an example of a fabrication process for PTEG devices, in accordance with various embodiments of the present disclosure.
Figure 19A:
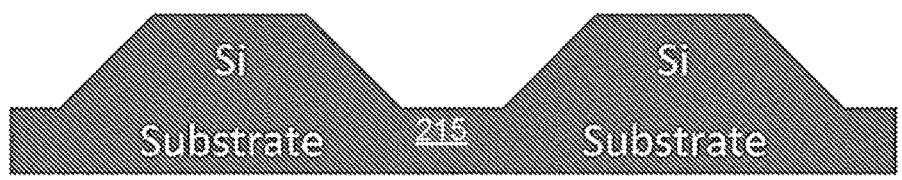
Figure 19B:
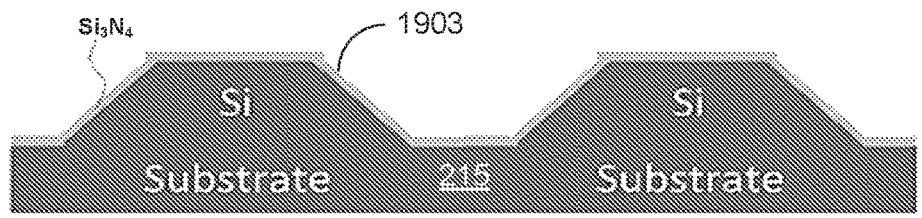
Figure 19C:
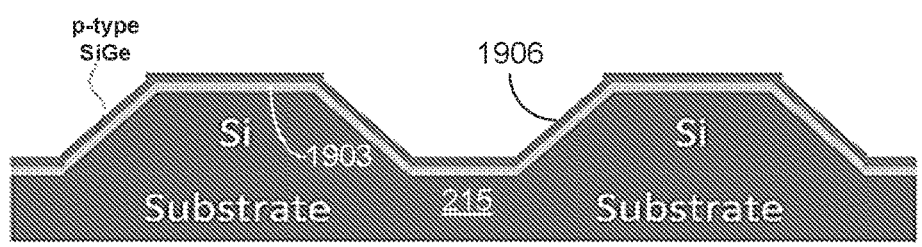
Figure 19D:
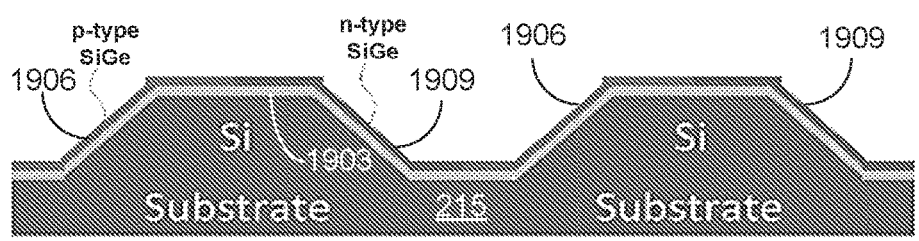

Referring next to FIG. 18, shown is a flow chart illustrating an example of a procedure for fabricating a PTEG device 1600. The fabrication process is shown for SiGe thermoelectric devices, but it can be adapted for the use of other thin film TE materials such as, e.g., Si and $(Bi,Sb)_2(Se,Te)_3$ based alloys. Beginning at 1803, a first wafer (e.g., a Si substrate) 215 can be water etched to form side walls with an angled slope, as illustrated in FIG. 19A. For example, bulk micromachining of the silicon via wet etching in chemicals (e.g., potassium hydroxide) can be used to create concentric pyramidal rings on the wafer 215. After the first wafer (or substrate) 215 is shaped, a layer 1903 of $Si_3N_4$ can be deposited on the sloped sidewalls of the rings at 1806, as illustrated in FIG. 19B. Thermoelectric material (e.g., $Si_{1-x}Ge_x$) can then be deposited at 1809. For example, a layer 1903 of SiGe can be deposited on the first wafer 215, as illustrated in FIG. 19C. Next, ion implantation can be carried out at 1812 to form n-type SiGe 1909, as illustrated in FIG.

19D. Patterning of the SiGe layers 1906 and 1909 forms thin film TE elements 203. Instead of the thermoelectric material deposition thickness, the Si etch depth determines the PTEG leg length allowing optimization of the aspect ratio independent of the film thickness. This ensures that the desired thermal resistance can be obtained to maximize the temperature differential, $\Delta T$, across the module.

Figure 19E:
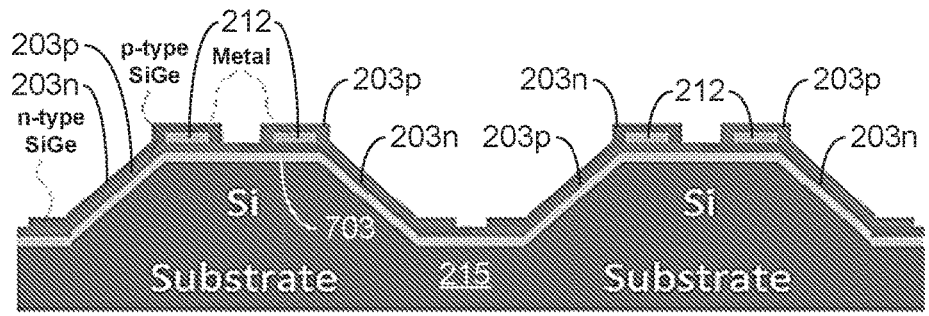
Figure 19F:
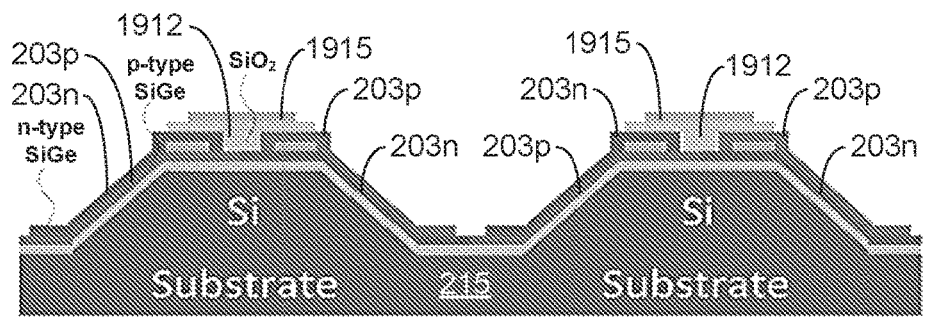
Figure 19G:
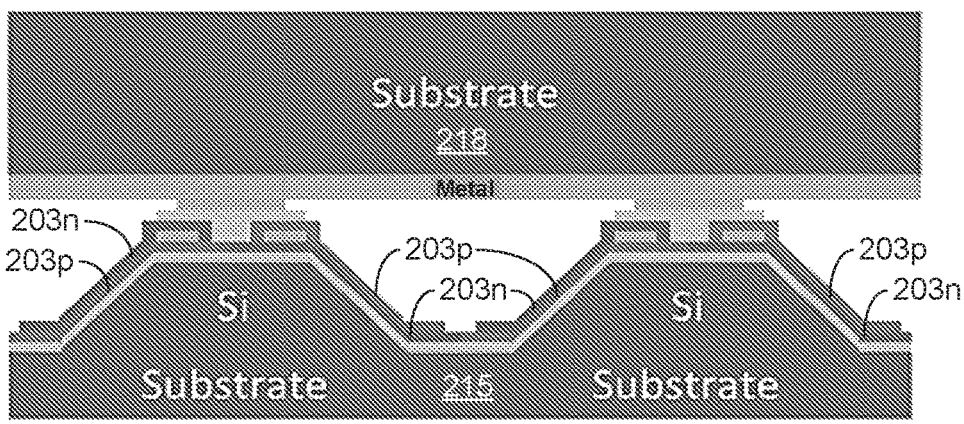

Next at 1815 of FIG. 18, metal 212 is deposited and patterned, and the second layer of SiGe is deposited and patterned to form the p-n junctions between TE elements 203, as illustrated in FIG. 19E. While a single layer of TE material can deliver a working device, multiple layers can be stacked to increase the module efficiency. The TE elements (or legs) 203 are isolated from each other by means of built-in depletion regions. A layer 1912 of $SiO_2$ can be deposited and patterned at 1818 for device insulation, and metal 1915 can be deposited and patterned for wafer bonding, as illustrated in FIG. 19F. A second wafer (or substrate) 218 can be bonded over the TE elements 203 at 1821. The second substrate 218 can then be bonded to the device using thermocompression in a vacuum, thereby sealing a vacuum between the concentric rings of TE elements 203, as shown in FIG. 19G. The individual substrates 215 and 218 are bonded in vacuum to seal the PTEG legs.

Figure 19H:
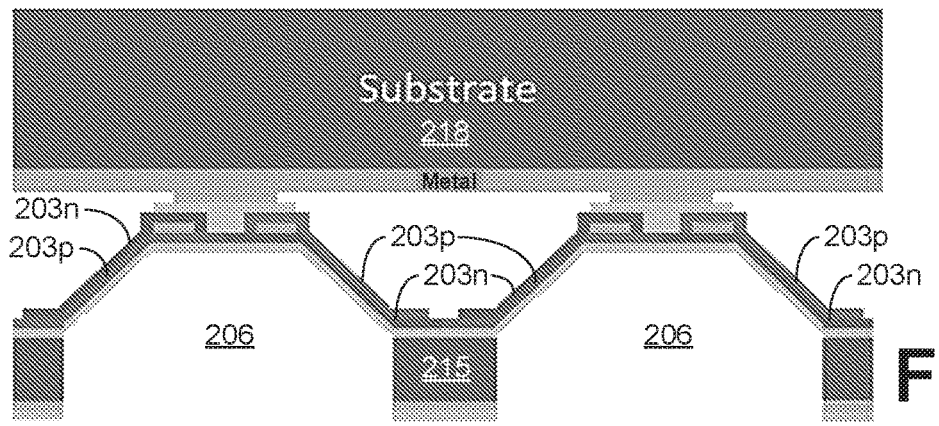
Figure 19I:
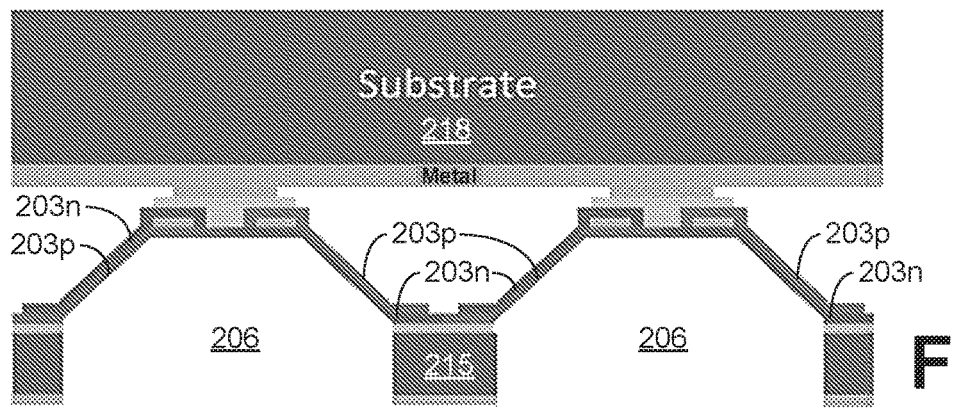
Figure 19J:
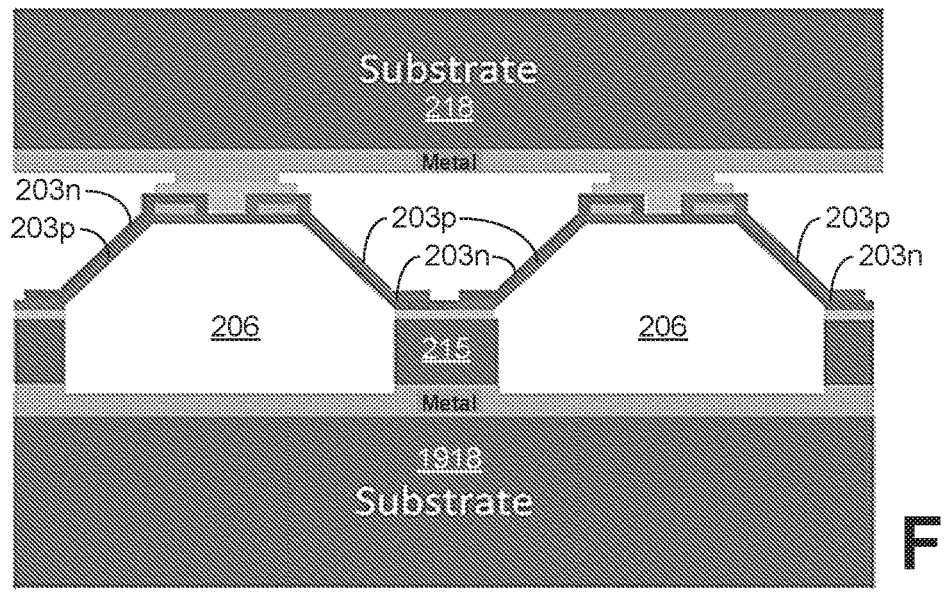

At 1824 of FIG. 18, metal and $SiO_2$ 1518 can be deposited and patterned on the backside of the first wafer 215, as illustrated in FIG. 19H. Air bridge structures shown in FIG. 19H can be obtained by etching the first substrate (or wafer) 215 to form voids 206 under the stacked TE elements 203. After etching away the Si in pyramidal rings below the thermoelectric legs 203 to avoid thermal shunting, individual substrates are bonded in vacuum to seal the PTEG legs. This eliminates heat leakage through the air, which can have a significant impact on the efficiency of the device. At 1827, the remaining $SiO_2$ layer can be removed. A new substrate 1918 can be bonded to the bottom of the first wafer 215 at 1830, as shown in FIG. 19J. For example, the new substrate 1918 can be bonded to the bottom of the device 1600 by, e.g., thermocompression in a vacuum.

Figure 20:
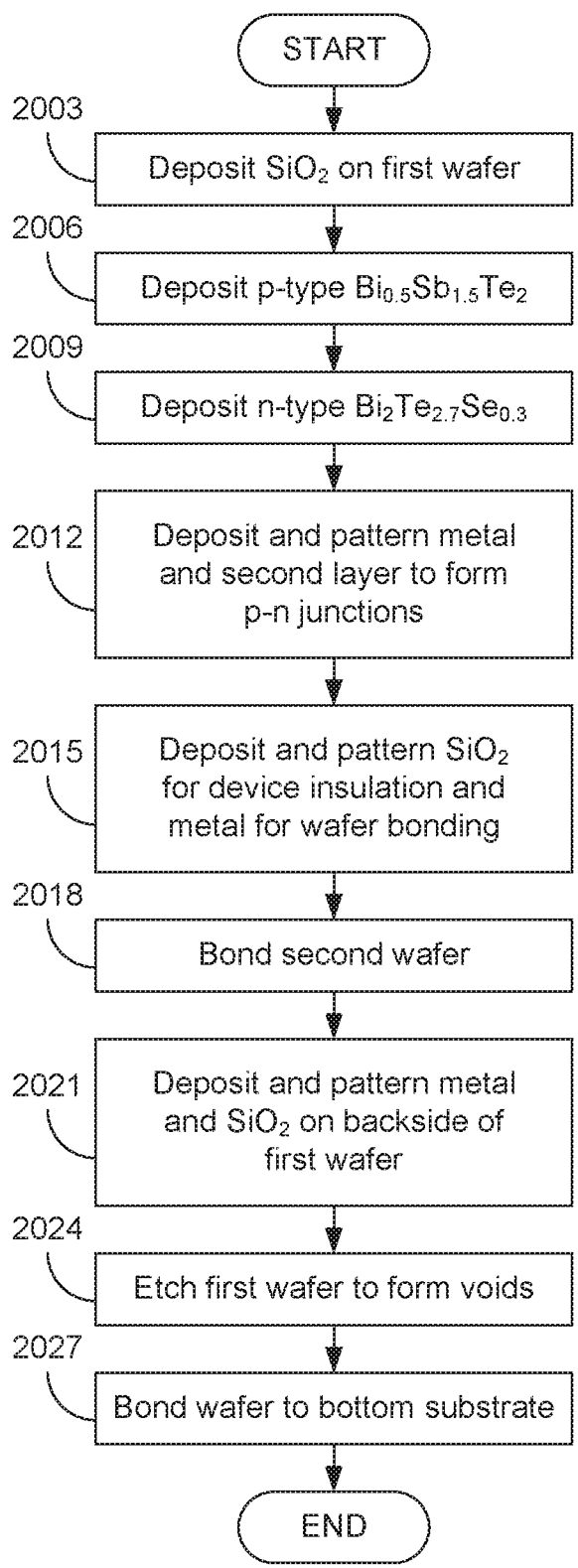
FIGS. 20 through 21J illustrate an example of a fabrication process for PTEG devices with a planar structure, in accordance with various embodiments of the present disclosure.
Figure 21A:
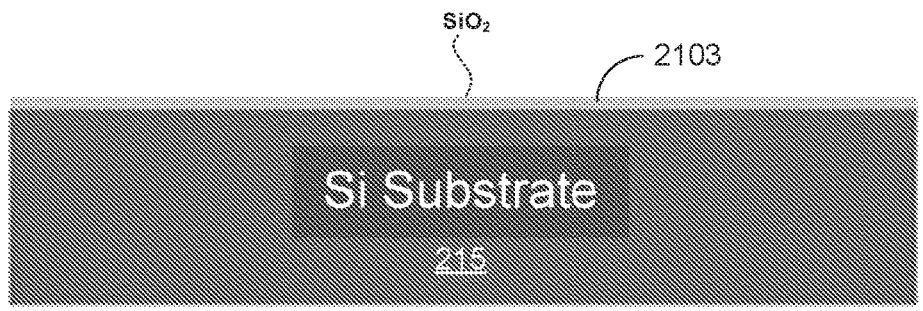
Figure 21B:
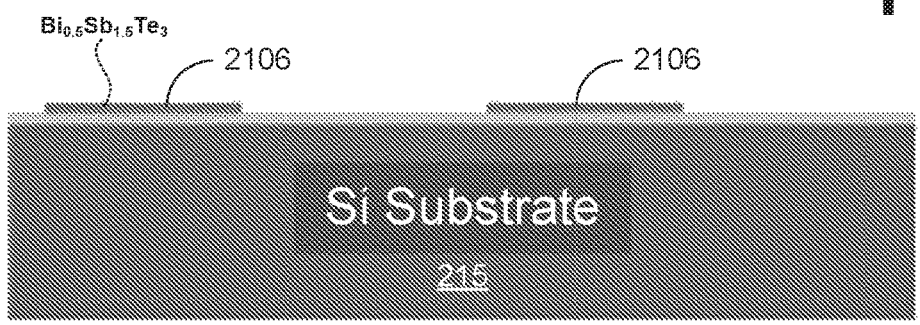

Referring next to FIG. 20, shown is a flowchart illustrating an example of a process flow for fabricating a PTEG device 1600 with a flat structure. The fabrication process is shown for $(Bi_{1-x}Sb_x)_2(Se_{1-y}Te_y)_3$ alloy based thermoelectric devices, but it can be adapted for the use of other thin film TE materials such as, e.g., Si and SiGe. Beginning at 2003, a layer 2103 of $SiO_2$ (e.g., 100 nm thick) can be deposited on the first wafer (e.g., Si) 215 using, e.g., a low-pressure chemical vapor deposition (LPCVD) method, as shown in FIG. 21A. Dual layers of photoresist (specific for lift-off purposes) can be spin coated and patterned on the $SiO_2$ layer 2103. For example, LOR resist from MicroChem Corp. can be employed because it can create a controllable undercut for lift-off purposes and also has a high thermal stability (up to 190° C.), which allows it to survive during the following material deposition process. Next at 2006, a layer 2106 of p-type $(Bi_{1-x}Sb_x)_2Te_3$ based material (e.g., 2 μm thick $Bi_{0.5}Sb_{1.5}Te_3$) can be deposited by, e.g., PLD at about 150° C. and then patterned by lift-off in photoresist remover, as illustrated in FIG. 21B. Dual layers of photoresist (specific for lift-off purpose) can then be spin coated and patterned on the $Bi_{0.5}Sb_{1.5}Te_3$ layer.

Figure 21C:
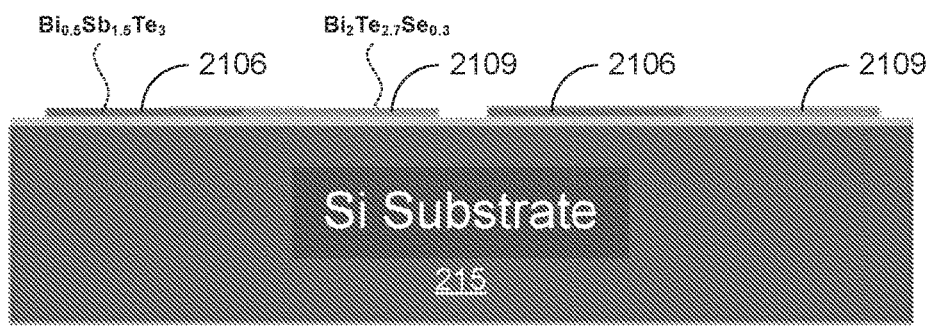
Figure 21D:
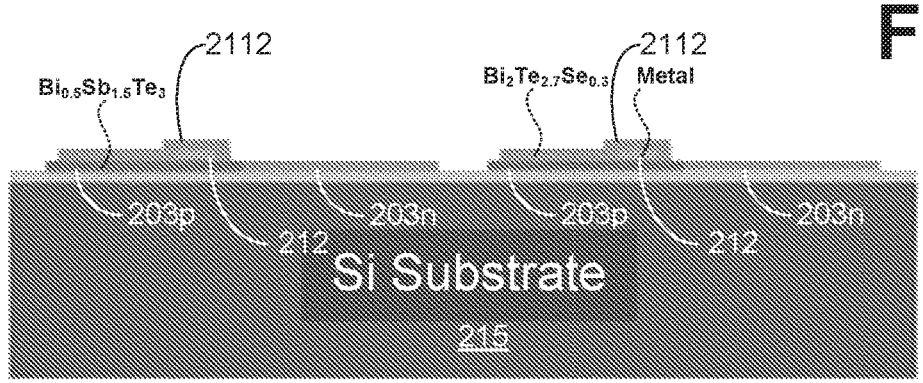
Figure 21E:
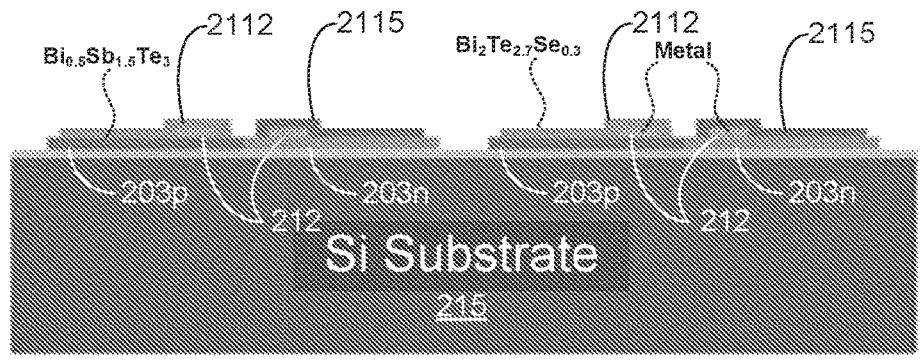

At 2009, a layer 2109 of n-type based $Bi_2(Se_{1-y}Te_y)_3$ material (e.g., 2 μm thick $Bi_2Te_{2.7}Se_{0.3}$) can be deposited by, e.g., a PLD technique at about 150° C. and then patterned by lift-off in photoresist remover, as shown in FIG. 21C. The patterned layers form a first layer of p-type and n-type TE elements 203. Metal 212 can then be deposited and patterned at 2012. Evaporation and lift-off can be used to form interconnects (e.g., 200 nm thick Ti) between adjacent p-type and n-type TE regions 203. This can be followed by deposition and patterning of a second layer comprising n-type regions 2112 and p-type regions 2115 (e.g., 2 μm thick) on the underlying p- and n-type TE elements 203 of the first layer, thereby forming vertical p-n junctions (or isolations), as illustrated in FIGS. 21D and 21E. The patterned layers 2112 and 2115 form the second layer of n-type and p-type TE elements 203. Evaporation and lift-off can be used to form interconnects (e.g., 200 nm thick Ti) between adjacent p-type and n-type TE regions. The films can then be annealed in argon to improve their electrical properties. Annealing temperature can be optimized through TE characterizations of several control samples (e.g., between 250° C. to 350° C.).

Figure 21F:
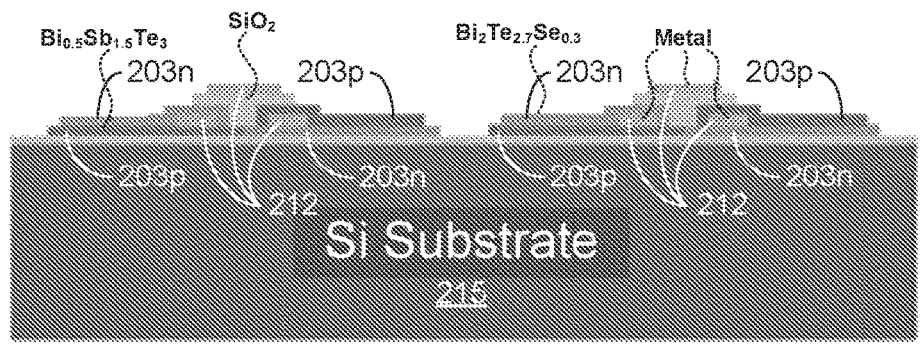
Figure 21G:
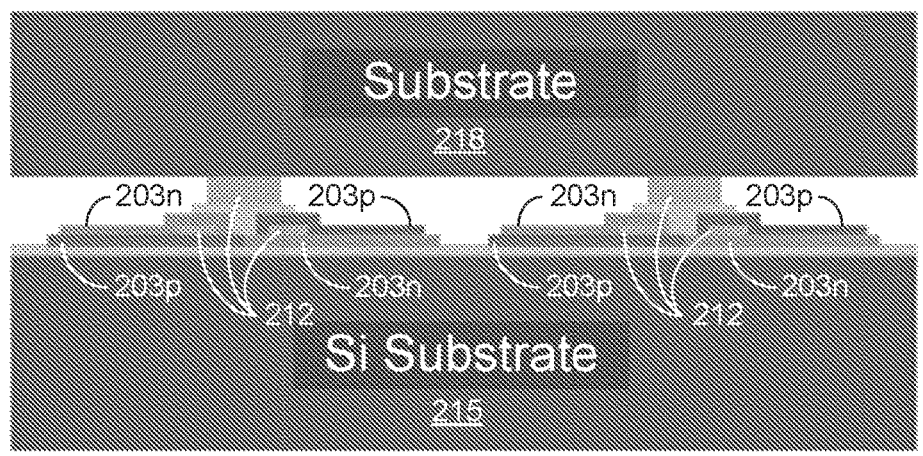

Next at 2015 of FIG. 20, $SiO_2$ can be deposited and patterned for device isolation and metal disposed for wafer bonding, as shown in FIG. 21F. A $SiO_2$ layer can be deposited by, e.g., plasma enhanced chemical vapor deposition (PECVD), and patterned using, e.g., photolithography and wet etching in buffered oxide etchant (BOE). This can then be followed by formation of metal contacts (e.g., 2 μm thick Ni/Sn) by evaporation and lift-off. At 2018, a second wafer (or substrate) 218 can be bonded over the TE elements 203, as illustrated in FIG. 21G. First, a metal alloy (e.g., 2 μm Ni/Sn) can be deposited and patterned on the second substrate 218 by, e.g., electroplating or e-beam evaporation and lift-off. The second substrate 218 can then be bonded to the device using thermocompression in a vacuum, thereby sealing a vacuum between the concentric rings of TE elements 203.

Figure 21H:
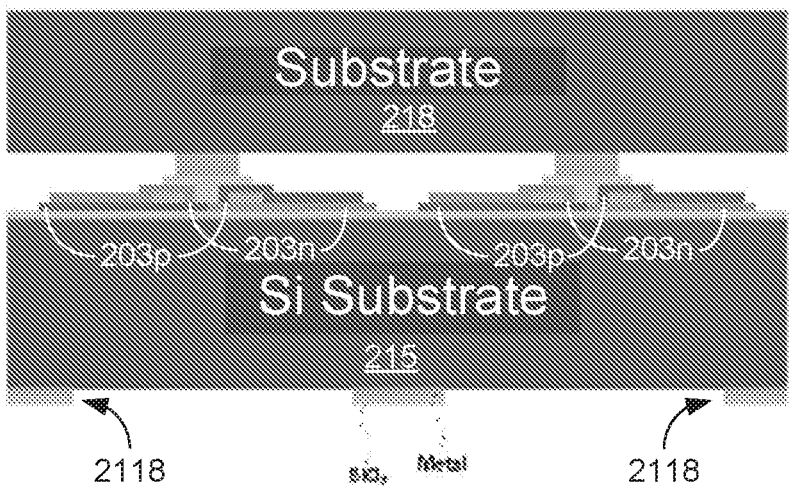
Figure 21I:
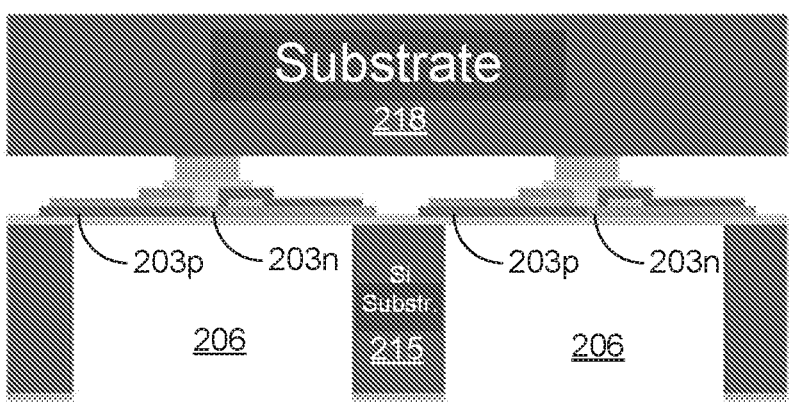
Figure 21J:
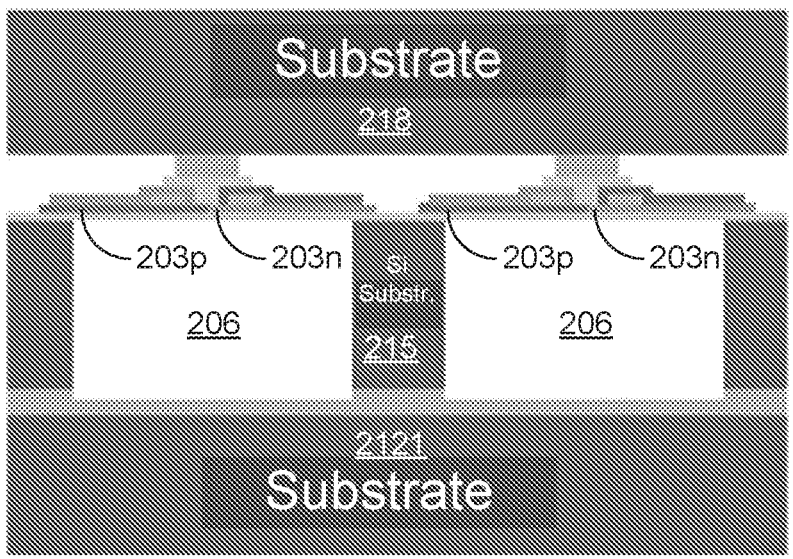

Next, metal and $SiO_2$ 2118 can be deposited and patterned on the backside of the first wafer 215, as illustrated in FIG. 21H. For example, Ni/Sn metal can be formed by electroplating or e-beam evaporation and lift-off on the bottom of the first substrate 215. This can be followed by PECVD of a $SiO_2$ layer (e.g., 2 μm thick), and patterned by photolithography and reactive ion etching (RIE). At 2024 of FIG. 20, the first substrate 215 can be etched to form voids 206 under the stacked TE elements 203, as shown in FIG. 21I. The first substrate (e.g., Si) 215 can be etched via deep reactive ion etching (DRIE) to obtain the voids under the TE elements. The remaining $SiO_2$ layer can be removed by wet etching in BOE. At 2027, a new substrate 2121 can be bonded to the bottom of the first wafer 215, as shown in FIG. 21J. For example, Ni/Sn metal alloy (e.g., 2 μm thick) can be deposited on the new substrate by electroplating or e-beam evaporation. The new substrate 2121 can then be bonded to the bottom of the device by, e.g., thermocompression in a vacuum.

Thermoelectric (TE) devices employing thin film structures have been achieved with standard micro-fabrication techniques, resulting in a large density of TE legs per unit area, less consumed material, and cost-effective wafer scale manufacturing method. In particular, the ability to fabricate a large number of TE elements per unit area (e.g., greater than $10^3$ per $cm^2$) enables making thermoelectric generators (TEGs) that can produce large output voltages. The small weight of the thin film TE device reduces the cost of assembly and installation. A method for fabricating such a thin film TE device is also disclosed. The fabrication process is shown for SiGe thermoelectric devices, but it can be adopted for using other thin film thermoelectric materials such as Si and $(Bi,Sb)_2(Se,Te)_3$ based alloys.

A three-dimensional thin-film thermoelectric energy generator (3D-TEG) have also been introduced. The 3D-TE device can comprise several thousands of microscale TE elements per square centimeter compared to the conventional devices, which allow it to generate larger output voltages. This is achieved by stacking of thin film elements in a three-dimensional configuration. A method for fabricating such a thin film TE device is also disclosed. The fabrication process is shown for $(Bi,Sb)_2(Se,Te)_3$ alloy based thermoelectric devices, but it can be adopted for using other thin film thermoelectric materials such as SiGe and Si.

A photo-enhanced, thin-film thermoelectric energy generator (PTEG) was also developed. The PTEG device combines multiple energy carriers, namely, electrons, holes, excitons, phonons, and photons, forcing the semiconductor legs to serve double duty and simultaneously harvest both heat and light energy. The PTEG device outperforms conventional thermoelectric modules by significantly reducing the thermal parasitic resistances and harvesting energy in the form of both heat and light. Furthermore, wafer-scale fabrication techniques that are compatible with conventional silicon integrated circuits and MEMS manufacturing are employed to fabricate the new device.

Thermal Spreaders. Three-dimensional (3D) circuits that integrate multiple devices such as optoelectronic and RF devices, logics, memory, and MEMS pose serious thermal management challenges due to the increasing heat load and non-uniform heat generation. An active thermal spreader comprising a combination of thermoelectric generators (TEGs) and/or thermoelectric coolers (TECs) will now be described. The same structures previously described for TE generation can also be used for TE cooling. The thermal spreader can be designed for adaptive integrated active cooling and hotspot mitigation in integrated circuits. Features of the thermal spreader technology include (i) solid-state active cooling, (ii) low or self-powered, (iii) adaptive and fast response, and (iv) high cooling power density.

Figure 22:
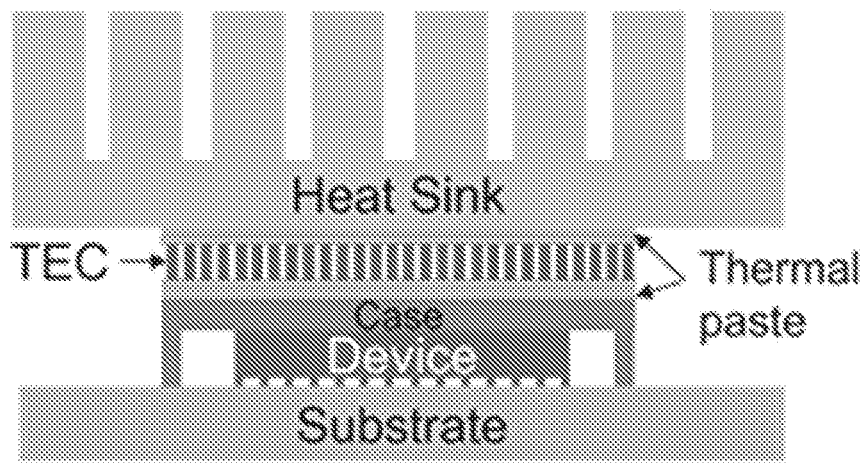
FIG. 22 illustrates an example of a conventional thermoelectric cooler (TEC) mounted on a case (or package) of an electronic device, in accordance with various embodiments of the present disclosure.

Conventional active cooling with thermoelectric coolers suffers from several shortcomings. First, due to their bulk device structure, they have small cooling power density (<10 W/cm$^2$) and need high operating current, i.e., several amperes. Second, the device cooling power is equally distributed over the whole area, which is an inefficient use of the power, especially when the temperature distribution is highly non-uniform across the area. Such a scenario often happens due to hot spot formation in electronic circuits. Another factor that impairs the effectiveness of the conventional TECs is related to the thermal interface resistance. These TECs are usually mounted on the case (or package) of the electronic devices, between the case and heat sink, as illustrated in the example of FIG. 22. Thermal paste can be included between the TEC and the case and/or heat sink as shown to improve heat flow. Therefore, the heat has to go through several interfaces, which leads to power loss and inefficiency of the cooler.

A thermal spreader can be based on multiple innovations at the device and system integration levels. The device level innovation is based on planar or quasi-planar thin-film TECs with high cooling power density or low operating current depending on the application. At the system integration level, the thin film TE devices are partially or completely powered by adaptive switching between the generating and cooling modes to greatly reduce the energy cost.

Figure 23:
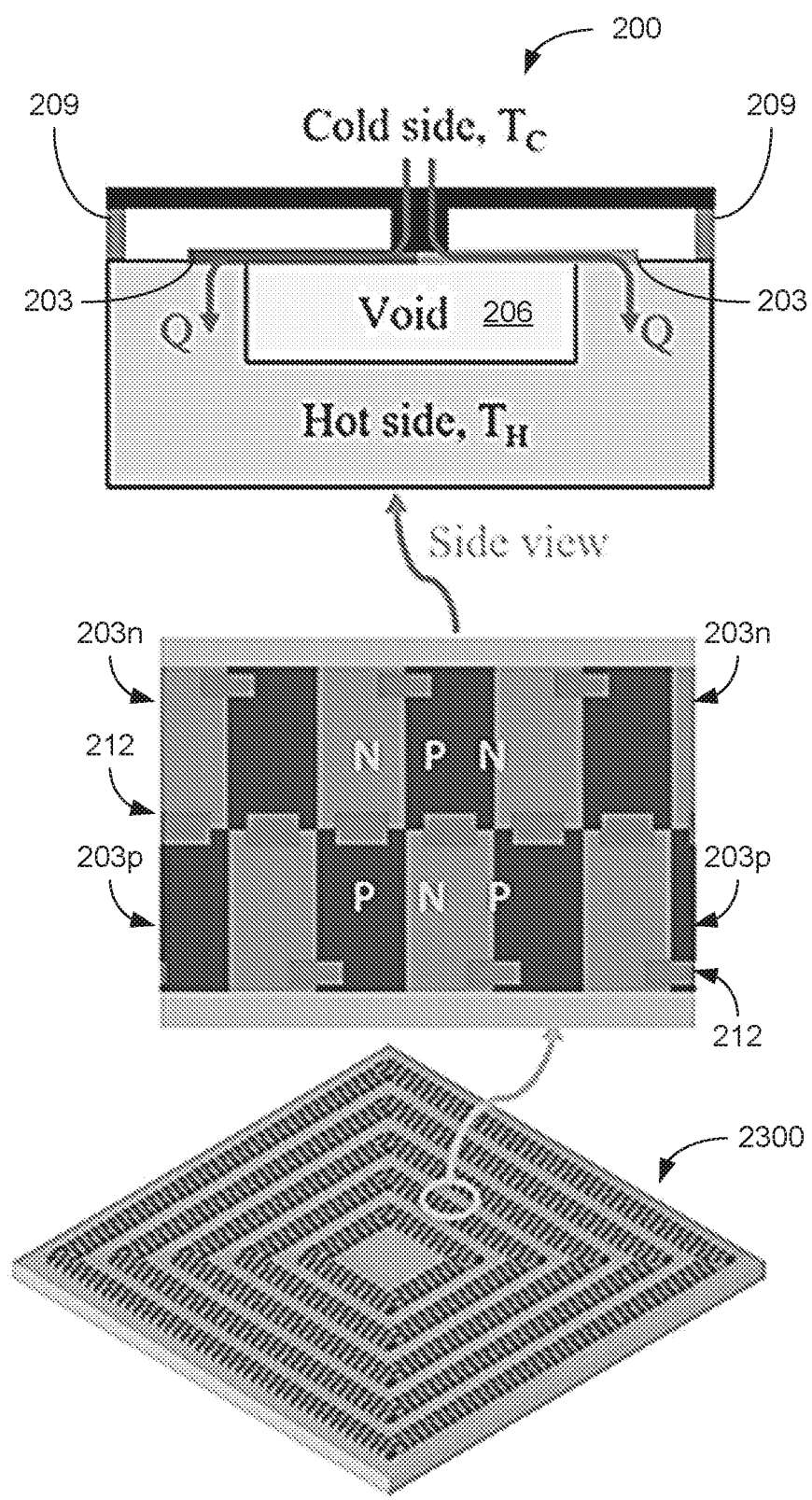
FIG. 23 is a schematic diagram illustrating an example of a planer TEC/TEG, including a graphical representation of a thin film TE device including planar thin film elements illustrating the concept (top), an arrangement of the p-type and n-type TE elements (middle), and a multi-ring self-sealed TEC/TEG device structure, in accordance with various embodiments of the present disclosure.

Device Level. The new TE module 2300 as illustrated in FIG. 23 comprises several thousand µm-scale planar TE elements 203 per cm$^2$ compared to the conventional devices, which consist of only dozens of mm-scale elements. In FIG. 23, the top representation illustrates the concept of cooling that can be provided by the thin film TE devices 200, and the middle representation illustrates the arrangement of p-type and n-type TE elements 203p and 203n in the multi-ring self-sealed TEC/TEG device structure of the TE module 2300 in the bottom representation. The TE module 2300 is especially efficient for power generation from low-temperature gradients. It is also efficient in the cooling mode and can operate with a current density that is orders of magnitude smaller than conventional devices.

Figures 24, 25:
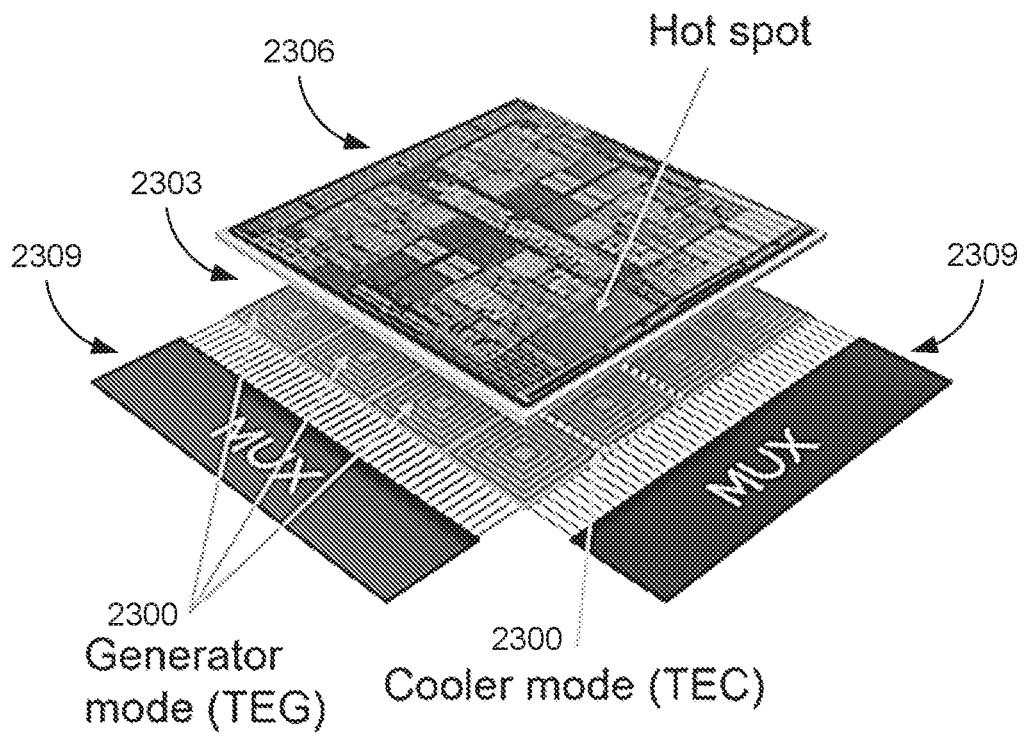
FIG. 24 is a schematic diagram illustrating an example of TEC/TEG integration with an integrated circuit, in accordance with various embodiments of the present disclosure.
FIG. 25 is a table illustrating an example of calculated energy harvested TEGs and the energy needed by the TECs to maintain the temperature of a CPU below 70° C., in accordance with various embodiments of the present disclosure.

System Integration Level. In the thermal spreader, the TE modules 2300 can be used to form a TE layer 2303 below or on top of an integrated circuit (IC) or device 2306 that is being cooled. The TE layer 2303 can comprise a matrix of TE modules 2300 as shown in FIG. 24 (e.g, a 4×4 array of TE modules 2300). One or more TE pair 203p/203n in each TE module 2300 can be used as a temperature sensor and can monitor the temperature of that region of the IC or device 2306. As soon as the sensor detects a hot spot, the TE module 2300 under (or over) the hot spot can then be switched to the cooling mode (TEC). The TE modules 2300 away from any hot spots can be switched to generation mode (TEG) and can be used to power up any TE modules 2300 in the cooling mode. Multiplexers (MUX) 2309, which are communicatively coupled to the TE modules 2300 in the TE layer 2303 illustrated in FIG. 24, can control the operation of each TE module 2300 and switch them into cooling (TEC) or generating (TEG) modes of operation based upon the temperature readings from the TE sensors. The MUX 2309 can compare the indications from the TE sensors and can switch between TEC/TEG operation in response to a comparison of the indications to one or more defined thresholds or limits. A power management unit can also be included to store energy from the power generating (TEG) modules 2300 and compensate any extra power needs to power up the cooling (TEC) modules 2300.

Referring to FIG. 25, shown is a table illustrating an example of calculated energy generation by TE generators, and the energy required for running the TE coolers at the target temperature of 70° C., in accordance with "Hotspot cooling and harvesting central processing unit waste heat using thermoelectric modules" by S. Lee et al. (*Journal of Electronic Packaging*, Vol. 137, pp. 031010-1 to 031010-9, September 2015), which is hereby incorporated by reference in its entirety. The first column shows different standard benchmarks for a CPU. It is shown that for all the tested benchmarks there is always more energy produced by the TEGs than what is needed to power up the TECs.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A thin film thermoelectric (TE) device, comprising:
a first substrate comprising a void;
a first p-type TE element attached to the first substrate at a first end and extending over the void to a second end;
a first n-type TE element attached to the first substrate at a first end and extending over the void to a second end adjacent to the second end of the first p-type TE element;
an interconnection directly coupling the second end of the first p-type TE element to the second end of the first n-type TE element, the interconnection attached to a second substrate positioned over the first p-type and first n-type TE elements opposite the void;
a second p-type TE element attached to the first substrate at a first end and extending over the void to a second end, the second p-type TE element adjacent to, in direct physical contact with and substantially parallel with the first n-type TE element;
a second n-type TE element attached to the first substrate at a first end and extending over the void to a second end adjacent to the second end of the second p-type TE element, the second n-type TE element adjacent to, in direct physical contact with and substantially parallel with the first p-type TE element; and
a second interconnection directly coupling the second end of the second p-type TE element to the second end of the second n-type TE element, the second interconnection attached to the second substrate.

2. The thin film TE device of claim 1, wherein the first substrate defines a hot side of the thin film TE device and the second substrate defines a cold side of the thin film TE device.

3. The thin film TE device of claim 1, wherein the first and second p-type and n-type TE elements are flat TE elements forming a planar structure across the void of the first substrate.

4. The thin film TE device of claim 1, wherein the first and second p-type and n-type TE elements extend at a fixed angle away from the first substrate toward the second substrate, the first and second p-type and n-type TE elements forming an air bridge structure across the void of the first substrate.

5. The thin film TE device of claim 1, wherein a length of the first and second p-type and n-type TE elements from the first end to the second end is greater than a perpendicular distance between the first and second substrates.

6. The thin film TE device of claim 1, further comprising a third interconnection coupling the first end of the first p-type TE element to the first end of the second n-type TE element or the first end of the first n-type TE element to the first end of the second p-type TE element.

7. The thin film TE device of claim 1, further comprising:
a second void in the first substrate;
a third p-type TE element attached to the first substrate at a first end and extending over the second void to a second end;
a third n-type TE element attached to the first substrate at a first end and extending over the second void to a second end adjacent to the second end of the third p-type TE element; and
a third interconnection coupling the second end of the third p-type TE element to the second end of the third n-type TE element, the third interconnection attached to the second substrate.

8. The thin film TE device of claim 7, further comprising a fourth interconnection coupling the first end of the first p-type TE element to the first end of the third n-type TE element or the first end of the first n-type TE element to the first end of the third p-type TE element.

9. The thin film TE device of claim 1, comprising a vacuum between the first and second substrates, wherein the first and second p-type and n-type TE elements are vacuum sealed between the first and second substrates by the vacuum.

10. The thin film TE device of claim 9, wherein the vacuum is sealed between the first and second substrates by an epoxy disposed between edges of the first and second substrates.

11. The thin film TE device of claim 1, wherein the first and second p-type and n-type TE elements comprise doped SiGe or doped Si.

12. The thin film TE device of claim 1, wherein the first and second p-type elements are comprised of $(Bi,Sb)_2Te_3$ and the first and second n-type elements are comprised of $Bi_2(Te,Se)_3$.

13. The thin film TE device of claim 1, wherein the thin film TE device is a TE generator (TEG).

14. A thin film thermoelectric (TE) device, comprising:
a first substrate comprising a void;
a first p-type TE element attached to the first substrate at a first end and extending over the void to a second end having a first interconnection disposed directly thereon;
a first n-type TE element attached to the first substrate at a first end and extending over the void to a second end adjacent to the second end of the first p-type TE element, the second end of the first n-type TE element having a second interconnection disposed directly thereon;
a second n-type TE element disposed directly on the first p-type TE element, the second n-type TE element extending from a first end adjacent to the first end of the first p-type TE element to a second end coupled to the second end of the first p-type TE element by the first interconnection, the second end of the second n-type TE element having the first interconnection disposed directly thereon; and
a second p-type TE element disposed directly on the first n-type TE element, the second p-type TE element extending from a first end adjacent to the first end of the first n-type TE element to a second end coupled to the second end of the first n-type TE element by the second interconnection, the second end of the second p-type TE element having the second interconnection disposed directly thereon;
wherein the second ends of the first and second p-type TE elements and the first and second n-type TE elements are attached to a second substrate positioned over the first and second p-type and n-type TE elements opposite the void.

15. The thin film TE device of claim 14, comprising:
a third p-type TE element disposed directly on the second n-type TE element, the third p-type TE element extending from a first end adjacent to the first end of the second n-type TE element to a second end adjacent to the second end of the second n-type TE element, the first end of the third p-type TE element coupled to the first end of the second n-type TE element by a third interconnection; and
a third n-type TE element disposed directly on the second p-type TE element, the third n-type TE element extending from a first end adjacent to the first end of the second p-type TE element to a second end adjacent to the second end of the second p-type TE element, the first end of the third n-type TE element coupled to the first end of the second p-type TE element by a fourth interconnection.

16. The thin film TE device of claim 14, further comprising:
a third p-type TE element attached to the first substrate at a first end and extending over the void to a second end, the third p-type TE element adjacent to and substantially parallel with the first n-type TE element;
a third n-type TE element attached to the first substrate at a first end and extending over the void to a second end adjacent to the second end of the third p-type TE element, the third n-type TE element adjacent to and substantially parallel with the first p-type TE element; and
a third interconnection coupling the first end of the third p-type TE element to the first end of the first n-type TE element.

17. The thin film TE device of claim 16, further comprising:
a fourth n-type TE element disposed directly on the third p-type TE element, the fourth n-type TE element extending from a first end adjacent to the first end of the third p-type TE element to a second end coupled to the second end of the third p-type TE element by a fourth interconnection, the fourth n-type TE element adjacent to and substantially parallel with the second p-type TE element; and
a fourth p-type TE element disposed directly on the third n-type TE element, the fourth p-type TE element extending from a first end adjacent to the first end of the third n-type TE element to a second end coupled to the second end of the third n-type TE element by a fifth interconnection, the fourth p-type TE element adjacent to and substantially parallel with the second n-type TE element;
wherein the second ends of the third and fourth p-type TE elements and the third and fourth n-type TE elements are attached to the second substrate.

18. The thin film TE device of claim 14, wherein the second substrate is transparent.

19. The thin film TE device of claim 14, wherein the thin film TE device is a TE generator (TEG).

20. A photo enhanced thermoelectric generator (PTEG), comprising:
a first plurality of thin film thermoelectric (TE) element pairs forming a first TEG layer, each of the first plurality of thin film TE element pairs comprising a p-type thin film TE element coupled to an n-type thin film TE element;
a second plurality of thin film thermoelectric (TE) element pairs forming a second TEG layer disposed on the first TEG layer, each of the second plurality of thin film TE element pairs comprising a p-type thin film TE element coupled to an n-type thin film TE element, where the p-type thin film TE elements of the second plurality of thin film TE element pairs are disposed directly on the n-type thin film TE elements of the first plurality of thin film TE element pairs and the n-type thin film TE elements of the second plurality of thin film TE element pairs are disposed directly on the p-type thin film TE elements of the first plurality of thin film TE element pairs, where contact between the p-type and n-type thin film TE elements thereby forms photosensitive vertical depletion regions between the directly disposed p-type and n-type thin film TE elements; and
a vacuum between a first supporting substrate and a second transparent substrate on opposite sides of the first and second TEG layers, wherein the first and second TEG layers are vacuum sealed between the first supporting substrate and the second transparent substrate by the vacuum.

21. The PTEG of claim 20, wherein the first and second TEG layers form a plurality of concentric rings of alternating thin film TE element pairs.

* * * * *